(12) United States Patent
Akino et al.

(10) Patent No.: US 6,225,876 B1
(45) Date of Patent: May 1, 2001

(54) FEED-THROUGH EMI FILTER WITH A METAL FLAKE COMPOSITE MAGNETIC MATERIAL

(75) Inventors: Tadaharu Akino, Sendai; Takashi Tanaka, Tokyo; Hisanori Sasaki, Tokyo; Yoshiaki Akachi, Tokyo; Tadashige Konno, Tokyo, all of (JP)

(73) Assignees: Electromagnetic Compatibility Research Laboratories Co., Ltd., Sendai; TDK Corporation, Tokyo, both of (JP)

( * ) Notice: Subject to any disclaimer, the term of this patent is extended or adjusted under 35 U.S.C. 154(b) by 0 days.

(21) Appl. No.: 09/267,620

(22) Filed: Mar. 15, 1999

(30) Foreign Application Priority Data

Mar. 20, 1998 (JP) .................................... 10-090713
Jan. 8, 1999 (JP) .................................... 11-002424
Jan. 8, 1999 (JP) .................................... 11-002454

(51) Int. Cl.$^7$ ........................................ H03H 7/01
(52) U.S. Cl. ............................ 333/182; 333/12; 333/185; 439/620

(58) Field of Search .............................. 333/12, 181, 182, 333/185; 439/620

(56) References Cited

U.S. PATENT DOCUMENTS

| | | | | |
|---|---|---|---|---|
| 2,782,381 | * | 2/1957 | Dyke | 333/182 |
| 3,289,118 | * | 11/1966 | Garstang | 333/182 |
| 4,197,146 | * | 4/1980 | Frischmann | 148/31.55 |
| 4,583,810 | * | 4/1986 | Gliha, Jr. | 333/185 X |
| 4,887,185 | * | 12/1989 | Okumura | 361/302 |
| 5,614,063 | * | 3/1997 | Graf et al. | 162/263 |

* cited by examiner

*Primary Examiner*—Justin P. Bettendorf
(74) *Attorney, Agent, or Firm*—Leydig, Voit & Mayer, Ltd.

(57) ABSTRACT

A feed-through EMI filter includes a hollow outer conductor, an inner conductor passing through the outer conductor, and a composite magnetic material of magnetic metal flakes disposed between the outer conductor and the inner conductor. Both ends of the outer conductor are closed by insulating lids supporting the inner conductor in a feed-through arrangement. The composite magnetic material has a higher complex relative permeability at GHz frequencies than ferrites and produces a large insertion loss.

19 Claims, 25 Drawing Sheets

FREQUENCY (GHz)

FREQUENCY (GHz)

FREQUENCY (GHz)

FREQUENCY (GHz)

FEED-THROUGH EMI FILTER WITH A METAL FLAKE COMPOSITE MAGNETIC MATERIAL

BACKGROUND OF THE INVENTION

1. Field of the Invention

The present invention relates to a feed-through EMI filter in which composite magnetic material comprising metallic magnetic powder and a binding material is made into an element for a filter, and more particularly to a feed-through EMI filter which is used in a power supply line of alternating and direct current, a signal line, a control line, etc., and which has a characteristic suitable for suppressing conductive electromagnetic interference (hereinafter, referred to as conductive EMI) of high frequencies (ranging from MHz to GHz) and has a simple structure.

2. Description of the Prior Art

Heretofore, a feed-through type EMI filter has been available having combined a cylindrical feed-through type capacitor 101 with ferrite bead 102 as shown in the conventional example 1 of FIG. 39 (Japanese Utility Model Publication No. 40512/1982, Japanese Utility Model Publication No. 40515/1982, etc.) or having combined a feed-through type capacitor 103 with ferrite bead 104 as shown in the conventional example 2 of FIG. 40 (Japanese Utility Model Publication No. 748/1991).

The cylindrical or disc-shaped feed-through type capacitor has no lead wire to cause a self-resonance owing to the inductance of lead wires. It has, however, a self-resonance based on the configuration, and the self-resonance frequency fo of the cylindrical feed-through type capacitor as shown in FIG. 41 is expressed by the following formula (1):

$$f_0 \approx \frac{3 \times 10^{10}}{2 \times L \times \sqrt{\varepsilon}} \text{ (Hz)} \quad (1)$$

where L is a length (cm) of electrode and $\varepsilon$ is a dielectric constant of ceramics. As a calculation example, let L be 1 cm and $\varepsilon$ be 5700, then the self-resonance frequency is expressed by 198 MHz. Further, the self-resonance frequency fo of the disc-shaped feed-through type capacitor as shown in FIG. 42 is expressed by the following formula (2):

$$f_0 \approx \frac{3 \times 10^{10}}{0.82 \times D \times \sqrt{\varepsilon}} \text{ (Hz)} \quad (2)$$

where D is an outer diameter (cm) of electrode and $\varepsilon$ is a dielectric constant of ceramics. As a calculation example, let D be 1 cm and $\varepsilon$ be 5700, then the self-resonance frequency is expressed by 484 MHz.

In the conventional examples 1 and 2 of FIGS. 39 and 40, as described above, the frequency characteristic of the reactance of the feed-through type capacitor is defined as shown in FIG. 43 owing to the self-resonance based on the configuration. When the frequency of the conductive EMI reaches the GHz band, the function of the feed-through type capacitor as the element for the filter is deteriorated. As it is evident from the frequency characteristic of the complex relative permeability ($\mu r'$, $\mu r''$) of samples A, B, C as shown in FIG. 44, the ferrite bead, i.e. the ferrite of a sintered compact causes dispersion phenomenon in the complex relative permeability when the frequency becomes higher, and its function as a series impedance element is deteriorated, though the mountain-shaped characteristic curve of an imaginary part ($\mu r''$) is observed.

By the way, recently as it is evident from the case of electronic equipment using digital circuitry, a clock frequency is made higher to the level of hundreds of MHz, and the frequency component of the electromagnetic interference owing to the higher harmonies even reaches the GHz band. The high frequency components superimposed by a power supply line, a signal line and a control line are conducted to the lines and leak outside the equipment as conductive EMI and are further radiated into the atmosphere from the lines.

To suppress such high frequency components as these, a method is available wherein the housing portion of the equipment is made from a shielded structure and each of said lines is equipped with the feed-through type EMI filter. There is a problem, however, in that the feed-through type EMI filters as shown in the conventional examples of 1, 2, are not effective to eliminate the conductive EMI in the GHz band.

SUMMARY OF THE INVENTION

A first object of the present invention is to provide a feed-through type EMI filter operative from MHz to GHz with a simple and low cost structure.

A second object of the present invention is to provide the feed-through type EMI filter for a magnetron tube which is able to satisfactorily eliminate and suppress conductive EMI generated from the magnetron tube by a simple and low cost structure.

According to the present invention, the feed-through type EMI filter can be realized wherein an inner conductor is arranged so that it penetrates into a hollow (pipe-shaped) outer conductor and the composite magnetic material comprising magnetic metal flakes as a main component is disposed between said outer conductor and said inner conductor. It is able to have an insertion attenuation characteristic large enough to reach a high frequency including GHz for the conductive EMI. The magnetic powder of Fe—Si, Fe—Ni, Fe—Al—Si families, or the like can be used as the magnetic metal flakes.

BRIEF DESCRIPTION OF THE DRAWINGS

The above described object and other objects as well as new features of the present invention will now be clarified with reference to the following description and drawings. Embodiments of the present invention are exemplified in these descriptions and drawing but it is apparent that various modifications can be made within the scope of the claims.

DETAILED DESCRIPTION OF PREFERRED EMBODIMENTS

Figure 1:
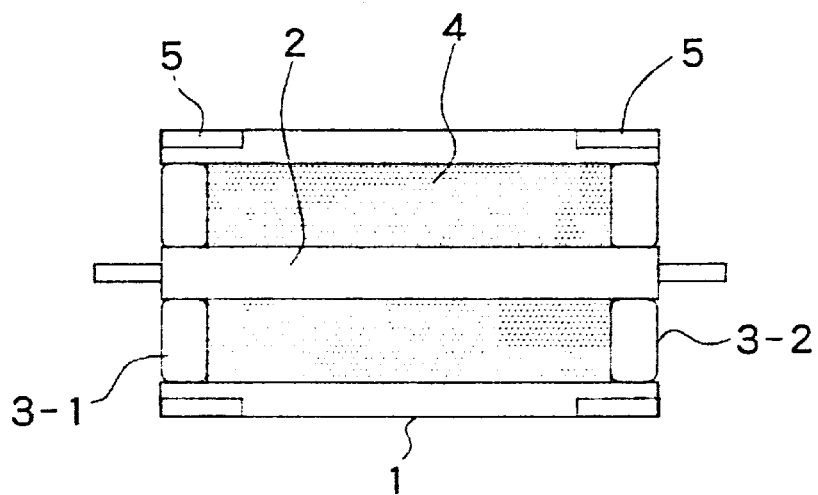
FIG. 1 is a front sectional view of a first embodiment illustrating a basic structure of the feed-through type EMI filter relating to the present invention.
Figure 2:
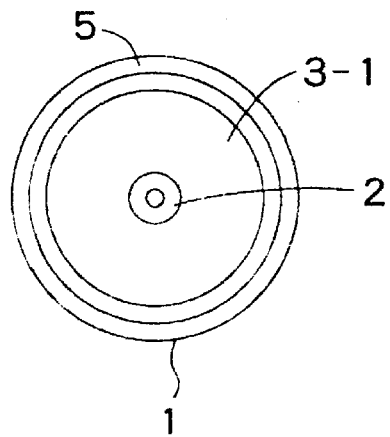
FIG. 2 is a side view thereof.

FIG. 1 is a front sectional view of a first embodiment illustrating the basic structure of a feed-through type EMI filter according to the present invention, and FIG. 2 is a side view thereof. As shown in these drawings, a metallic cylinder 1 of brass, or the like is used as a pipe-shaped (include cylindrical) outer hollow conductor and, in its center, an inner conductor 2 (a center conductor) is disposed coaxially so as to constitute a coaxial tube. At one end of this coaxial tube, a lid 3-1 made of insulating resin of PBT (Poly butadien telephthalate) or the like is disposed. From the other end, a composite magnetic material 4 (heat moldings) is inserted and, after that, it is sealed by the lid 3-2 made of insulating resin which is the same with the lid 3-1. The insulating resin made lids 3-1, 3-2 close and hold both end opening portions of the metallic cylinder 1 so as not to slip off the composite magnetic material 4 and coaxially support said inner conductor 2 in a penetrant state. A screw thread portion 5 used for fixing housings etc. of electronic equipment or connecting a coaxial connector is formed at both ends of an outer face of the metallic cylinder 1.

In this case, instead of using the composite magnetic material 4 molded in advance, after the composite magnetic material in which magnetic powder and resin powder are blended and mixed is pressurized and filled into said coaxial tube, they may be heated and hardened As the composite magnetic material 4 in high frequency band (from MHz band to GHz band), a composite magnetic material using scaly (flaky) magnetic powder of Fe—Si alloy about 40 to 50 $\mu$m long, about 10 $\mu$m wide and about 10 $\mu$m thick wherein complex relative permeability ($\mu r'$, $\mu r''$) and complex relative permittivity ($\epsilon r'$, $\epsilon r''$) can be set in a high degree, and composite magnetic material which uses low-cost polyester family resin having a formability and a heat stability as a binder are heated and hardened to a predetermined shape (to a cylindrical shape in case of the present embodiment). In case the composite magnetic material 4 is formed by a heat molding in advance, the upper limit of a weight-% of the magnetic powder and the resin powder is about 80:20 in view of formability. In the constitution wherein the magnetic powder and the resin powder are heated and hardened after they are pressurized and filled into said coaxial tube, the weight-% of the magnetic powder and the resin powder can be raised to about 95:5. Further, the lower limit of a compounding ratio of the magnetic powder is required to be not less than 50% by weight so as to secure sufficient attenuation. If it is not more than 50% by weight, its characteristic as a magnetic material is largely deteriorated.

Figure 3A:
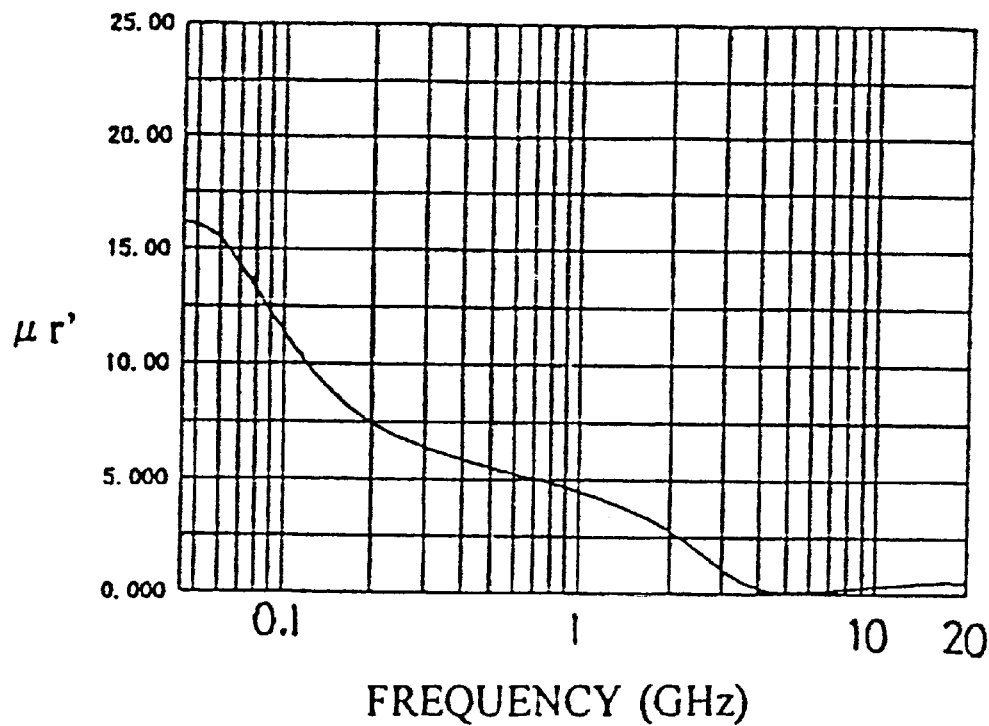
FIGS. 3(A) and 3(B) are graphs showing the frequency characteristic of the complex relative permeability of the composite magnetic material used in the first embodiment.
Figure 3B:
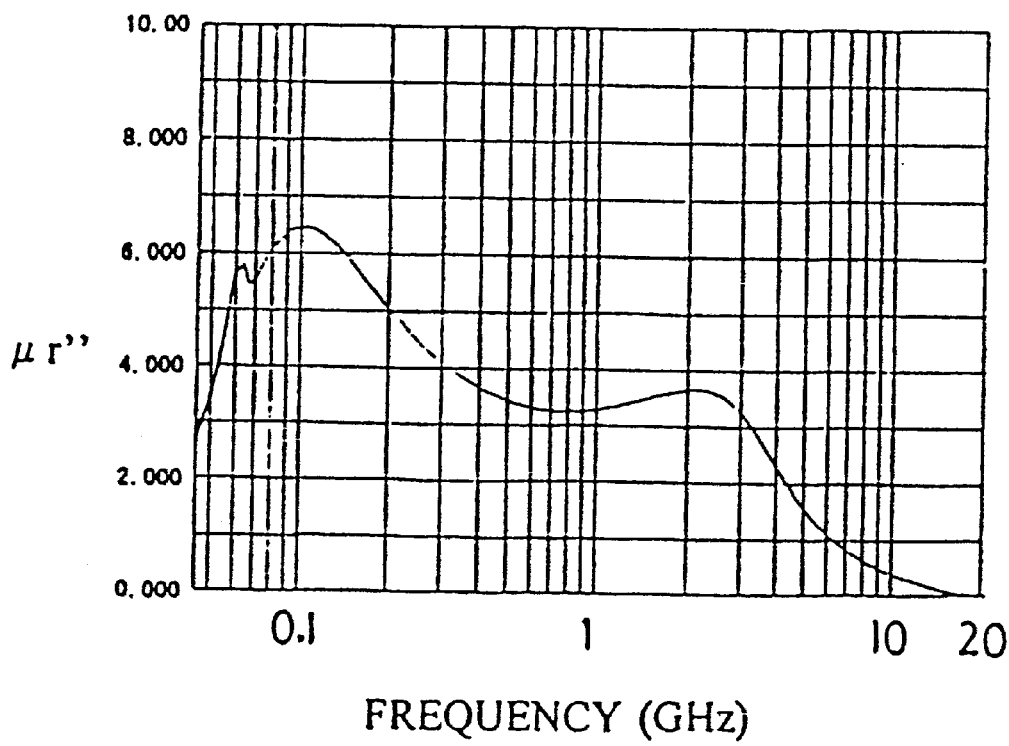
Figure 4A:
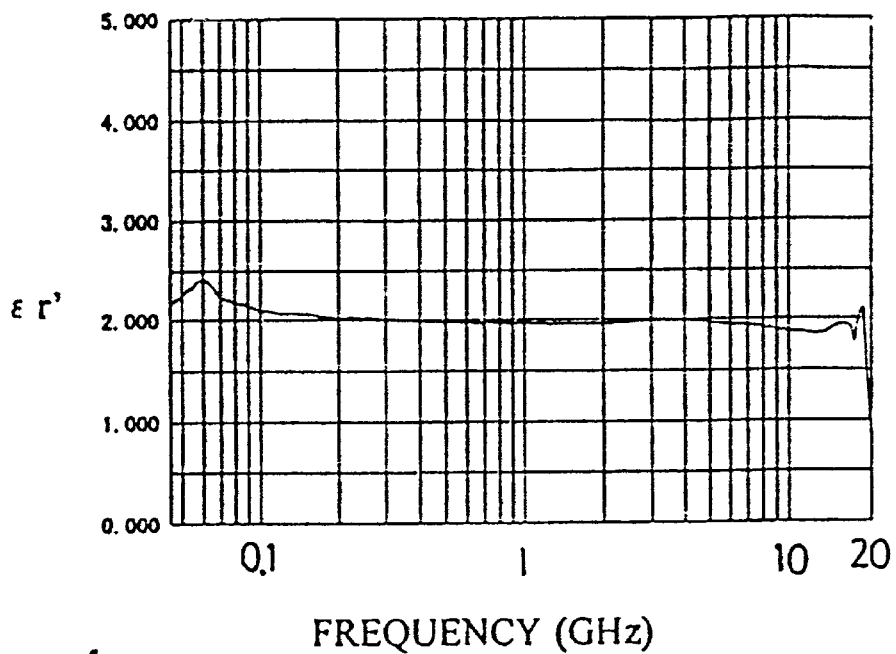
FIG. 4(A) and 4(B) are graphs showing the frequency characteristic of the complex relative permittivity of the composite magnetic material used in the first embodiment.
Figure 4B:
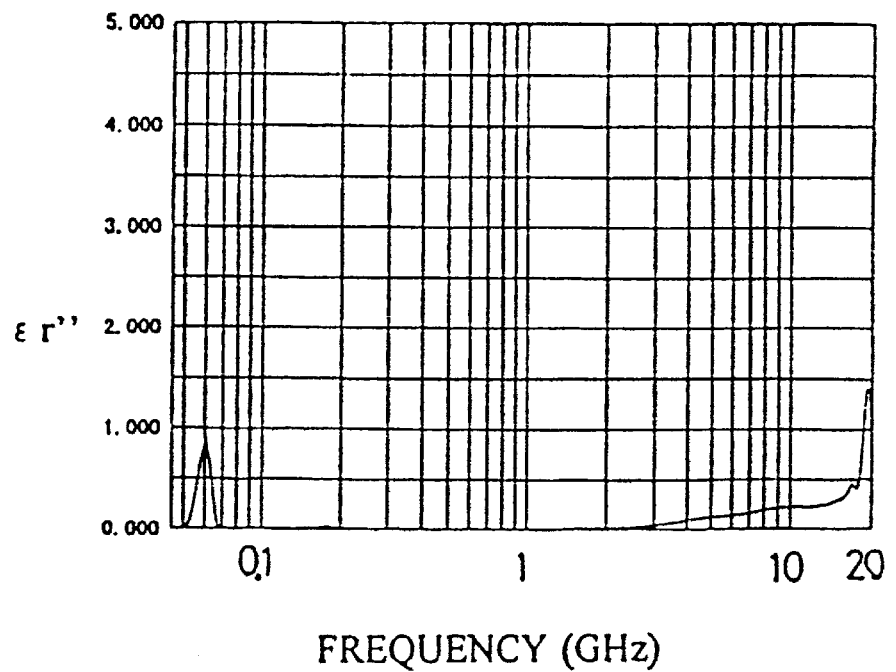

The complex relative permeability and the complex relative permittivity carried by the composite magnetic material 4 (the magnetic powder 80% by weight and the binder 20% by weight) are as shown in FIGS. 3(A) and FIG. 3(B) and FIGS. 4(A) and 4(B) The complex relative permeability ($\mu r'$, $\mu r''$) as shown in FIGS. 3(A) and 3(B) is required to show a value as large as possible till it reaches a higher frequency region in view of the attenuation at the GHz band. The real part $\mu r'$ of the complex relative permeability at 1 GHz is preferable to be not less than 3 and the imaginary part $\mu r''$ to be not less than 2.

Figure 5:
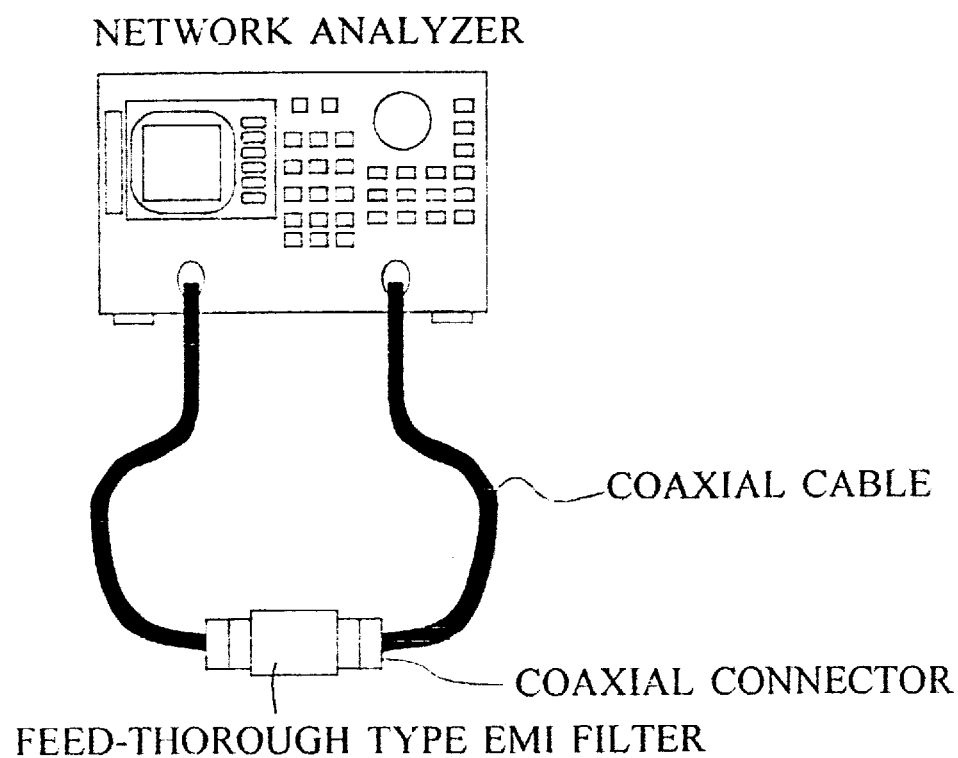
FIG. 5 is an explanatory drawing illustrating the measuring method of the insertion loss characteristic of the feed-through type EMI filter shown in the first embodiment.
Figure 6:
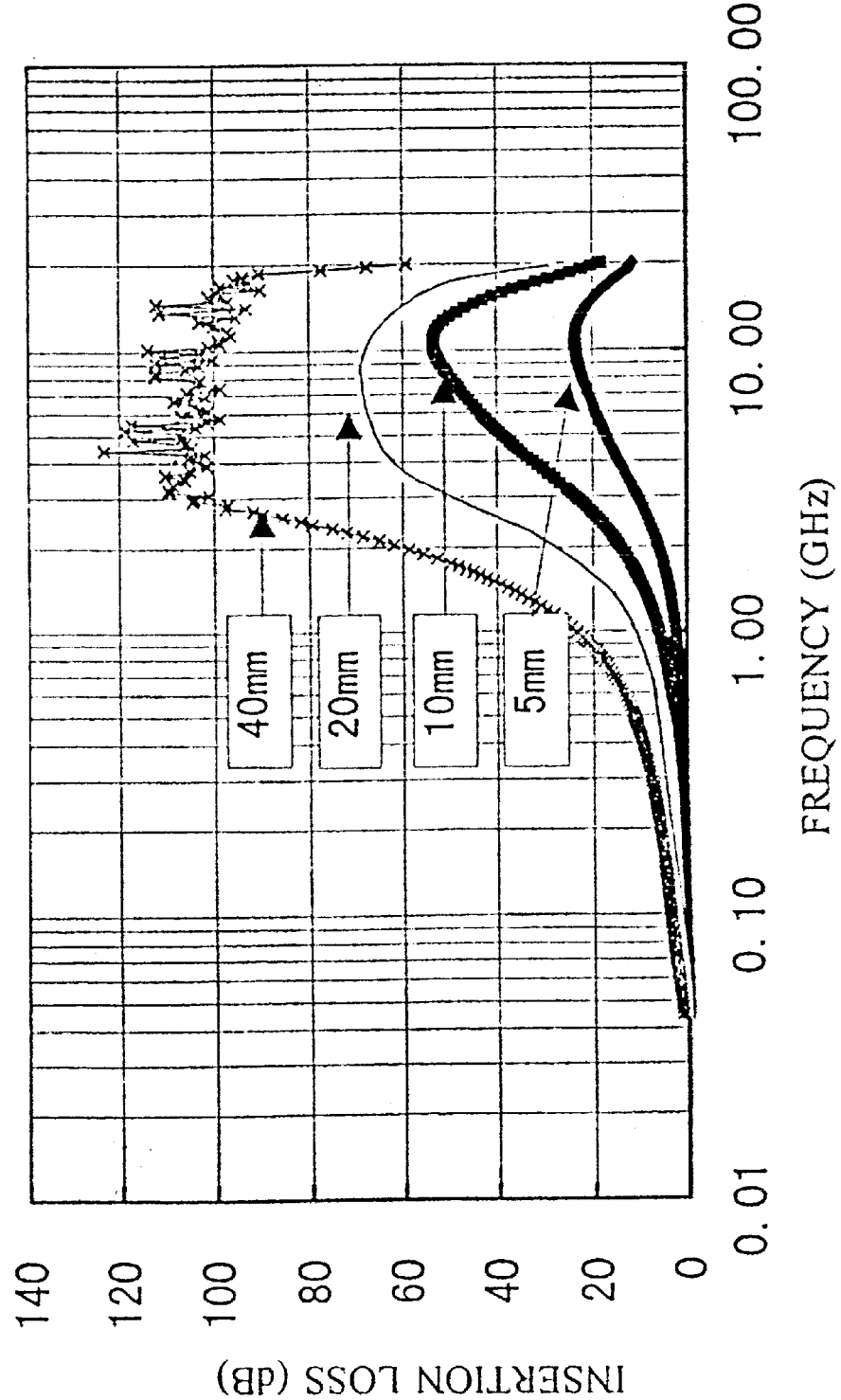
FIG. 6 is a graph in which the frequency characteristic of the insertion loss characteristic of the feed-through type EMI filter shown in the first embodiment is measured at a length in 5 mm, 10 mm, 20 mm and 40 mm respectively of composite magnetic material.

The measurement result by a two port method using a network analyzer as shown in FIG. 5 of the frequency characteristic of the insertion loss of the feed-through type EMI filter as shown in FIG. 1 in which the composite magnetic material is inserted into the coaxial tube is shown in FIG. 6. Where the insertion loss was measured with the length of the composite magnetic material 4 in the coaxial tube axial direction changed to 5 mm, 10 mm, 20 mm and 40 mm.

Figure 7:
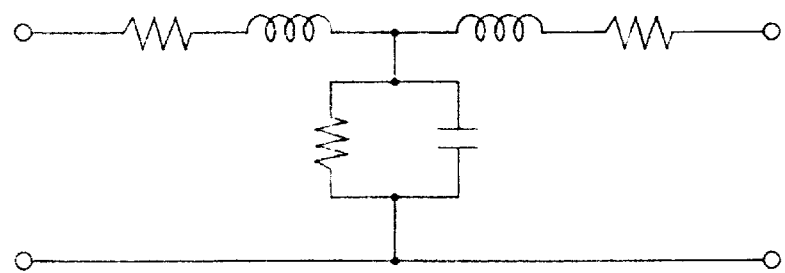
FIG. 7 is an equivalent circuit diagram of the feed-through type EMI filter shown in the first embodiment.

This feed-through type EMI filter is regarded as a distributed constant circuit and an equivalent circuit per a unit length is as shown in FIG. 7.

The insertion loss α [dB] of this feed-through type EMI filter is expressed by the following formula:

$$\alpha \approx 3 \times f \times \sqrt{\mu'_r \cdot \varepsilon'_r} \left[ \sqrt{(\tan^2\delta_M + 1)(\tan^2\delta_D + 1)} + \tan\delta_M \cdot \tan\delta_D - 1 \right]^{1/2} \text{ [dB/cm]}$$

where, f: frequencies (GHz)

$$\tan\delta_M = \frac{\mu''_r}{\mu'_r}$$

$$\tan\delta_D = \frac{\varepsilon''_r}{\varepsilon'_r}$$

As described in the basic first embodiment, this feed-through type EMI filter is able to have the advantageous effects as follows.

(1) It has a large insertion loss characteristic in the high frequency (particularly in GHz band) for the conductive EMI conducting a power supply line of alternative and direct current, a signal line, a control line, etc.

In the conventional feed-through type EMI filter combining the ferrite bead and the cylindrical or disc-shaped ceramic feed-through type capacitor, the frequency in which dispersion of the complex relative permeability (which is about 40 MHz in the case of an initial magnetic permeability 100) is low and the the mountain-shaped characteristic curve of an imaginary part ($\mu r''$) (which has an effect on absorption loss) of the complex relative permeability appears in the low frequency (which is about 60 MHz in the case of an initial magnetic permeability 100), thus the existence value of the ferrite bead is brought to nothing.

The cylindrical or disc-shaped ceramic feed-through capacitor causes also a resonance phenomenon owing to the configuration when it comes to the GHz band, and a reactance changes from a capacitive reactance to an inductive reactance and brings about the deterioration of the insertion loss characteristic which has a relation to suppression characteristic of the conductive EMI.

Over against this, the feed-through type EMI filter as shown in the embodiment of the present invention is basically the distributed constant circuit in which no resonance phenomenon appears as observed in the conventional feed-through type EMI filter which is of a lumped parameter circuit. A Fe—Si magnetic material can hold the $\mu r'$ up till a higher frequency by being converted to the composite magnetic material, and subsequently the mountain-shaped characteristic curve of an imaginary part ($\mu r''$) can also be changed to a higher frequency. As a result, the insertion loss characteristic ranging from the MHz band to the GHz band can be made satisfactory.

(2) Dispersion in characteristic can be reduced owing to a simple structure. The conventional feed-through type EMI filter combining ferrite bead and the cylindrical or disc-shaped ceramic feed-through capacitor tends to increase the number of elements and hence causes dispersion in characteristic.

(3) A reduction in cost is possible owing to a simple structure that is easy to assemble.

The conventional feed-through type EMI filter which combines the ferrite bead and the ceramic feed-through capacitor has a complex assembling structure and is required to electrically connect the ceramic feed-through capacitor to the outer conductor and the inner conductor by soldering, etc. with a result that the cost thereof becomes high.

Figure 8:
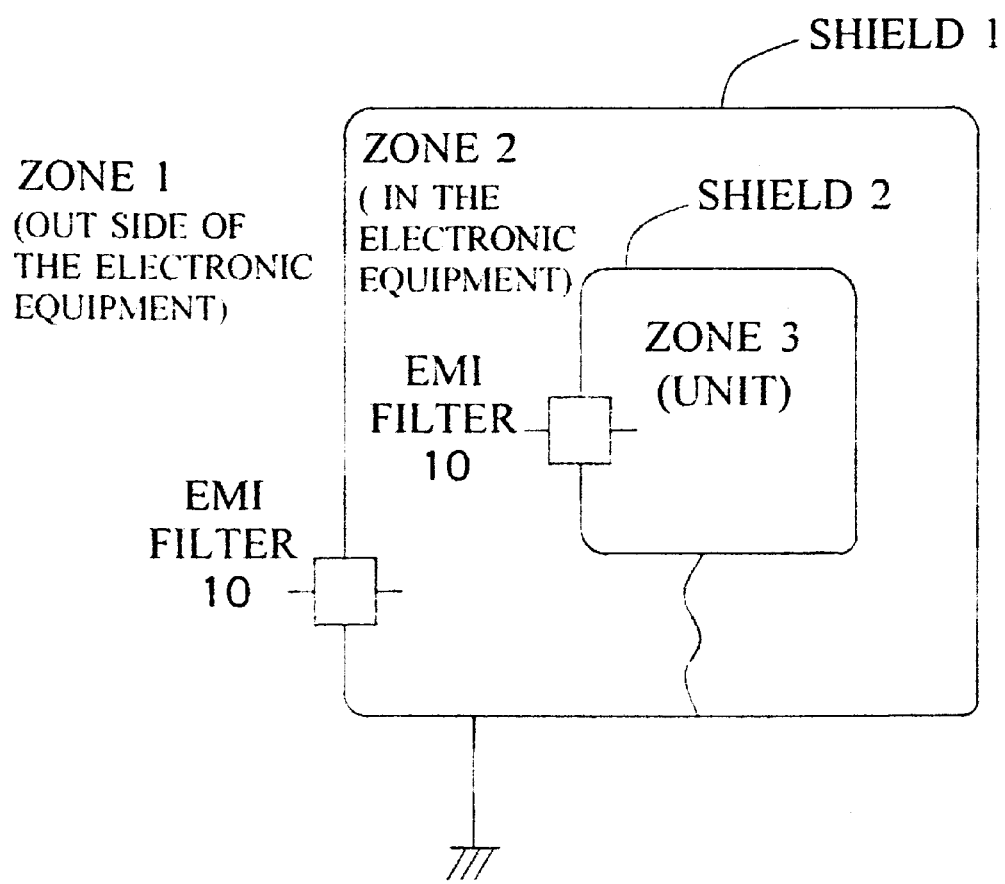
FIG. 8 is an explanatory drawing illustrating EMI countermeasures by means of a zone separation.

FIG. 8 is an explanatory drawing illustrating EMI countermeasures by the separation of zones using the feed-through type EMI filter as shown in the first embodiment. The housing portion of the electronic equipment is made from a shielding structure, i.e. a shield 1, and a zone 1 outside of the electronic equipment and a zone 2 in the electronic equipment are shielded and the feed-through type EMI filter 10 is connected to the power supply line of alternating and direct current, the signal line, the control line, etc. Further, a method is adapted to shield a zone 3 of the specific unit in the zone 2 by a shield 2 and to connect the feed-through type EMI filter 10 on each of said lines.

Figure 9A:
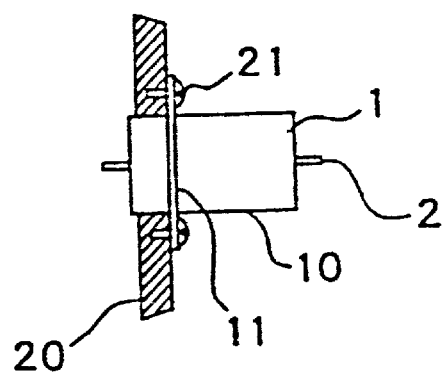
FIGS. 9(A), 9(B), and 9(C) are explanatory drawings illustrating each of fixing structures of the feed-through type EMI filter shown in the first embodiment.
Figure 9B:
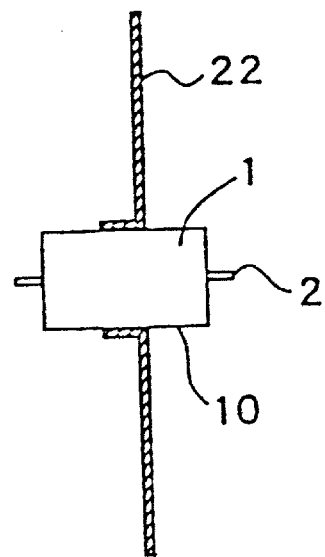
Figure 9C:
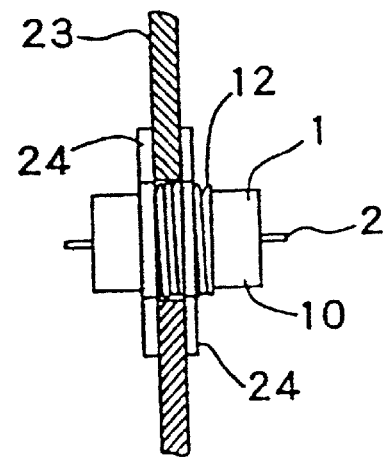

FIGS. 9(A), 9(B), and 9(C) are explanatory drawings illustrating the fixing structure to a conductive shielding partition wall of the feed-through type EMI filter as shown in the first embodiment. In FIG. 9 (A), a metal collar 11 for mounting disposed on the metal cylinder 1 as an outer conductor to be fixed onto the shielding partition wall 20 by screws 21. In FIG. 9(B), the metal cylinder 1 as the outer conductor is inserted into the pass-through hole of the shielding partition wall 22 and the metal cylinder 1 is made to functionally contact to the pass-through hole of the shielding partition wall 22. In FIG. 9(C), an internal thread portion 12 is disposed on the outer face middle portion of the metal cylinder 1 to be fixed onto the shielding partition wall 23 by nuts 24. Further, though not shown in the drawings, the structure of the shielding partition wall may be such that the metal cylinder is integrally united with the metal collar for soldering.

Figure 10:
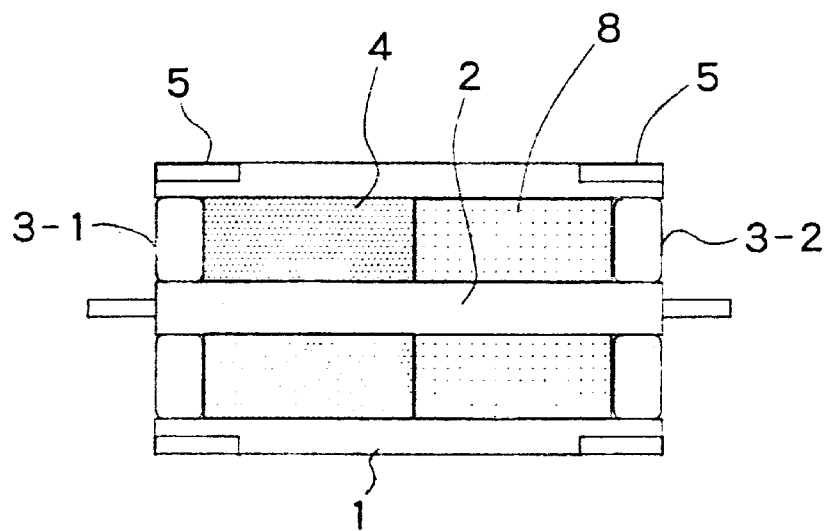
FIG. 10 is a front sectional view illustrating a second embodiment of the present invention.

FIG. 10 shows a second embodiment of the present invention. In this case, the inner conductor 2 is coaxially disposed in the center of the metal cylinder 1 to constitute a coaxial tube, and the lid 3-1 made of insulating resin body of PBT, etc. is disposed on one end of this coaxial tube. From the other end, the composite magnetic material 4 (heat moldings) and the ferrite bead 8 of cylindrical sintered ferrite are inserted one after another and, after that, they are sealed by the lid 3-2 made of insulating resin which is the same with the lid body 3-1. The lid 3-1, 3-2 made of insulating resins close and hold both end opening portions of the metal cylinder 1 so that the composite magnetic material 4 and the ferrite bead 8 do not slip off. In this case, instead of using the composite magnetic material 4 molded in advance, after the composite magnetic material in which magnetic powder and resin powder are mixed and blended is pressurized and injected into the coaxial tube already disposed with the ferrite bead, it may be heated and hardened. More, it is preferable to use ferrite bead of Ni—Zn family, etc. which is suitable for the high frequency band.

Further other structures are the same with the first embodiment as described above.

In the second embodiment, both the composite magnetic material 4 in which the flaky magnetic powder of Fe—Si alloy is blended and the ferrite bead 8 are disposed inside the coaxial tube in a multiple string state, thereby the attenuation in the GHz band can be sufficiently secured by the composite magnetic material 4 and the attenuation in the MHz band can be sufficiently secured by the ferrite bead 8.

Figure 11:
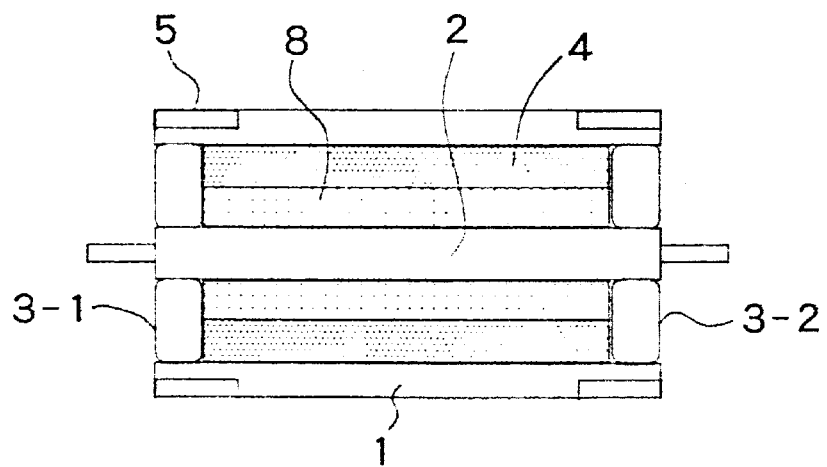
FIG. 11 is a front sectional view illustrating a third embodiment of the present invention.

FIG. 11 shows a third embodiment of the present invention. In this case, an inner conductor 2 is coaxially arranged in the center of a metal cylinder 1 to constitute a coaxial tube, and an lid 3-1 made of insulating resin body of PBT, etc. is disposed at one end of this coaxial tube. From the other end, ferrite bead 8 comprising of cylindrical sintered ferrite with a small diameter and cylindrical composite magnetic material 4 (heat moldings) with a large diameter are coaxially inserted and, after that, they are sealed by an lid 3-2 made of insulating resin which is the same with the lid body 3-1. The lid 3-1, 3-2 made of insulating resins close and hold both end opening portions of the metal cylinder 1 so that the composite magnetic material 4 and the ferrite bead 8 do not slip off. In this case, instead of using the composite magnetic material molded in advance, after the composite magnetic material in which magnetic powder and resin powder are mixed and blended is pressurized into the coaxial tube already disposed with the ferrite bead, it may be heated and hardened.

Further, other structures are the same with the first embodiment as described above.

In the third embodiment, ferrite bead 8 with a small diameter is disposed around the inner conductor 2 and, further, the composite magnetic material 4 with a large diameter in which flaky magnetic powder of Fe—Si alloy is blended is coaxially disposed on the outer peripheral side of the ferrite bead 8, thereby an attenuation in the GHz band can be sufficiently secured by the composite magnetic material 4 and the attenuation in the MHz band can be sufficiently secured by the ferrite bead 8.

Figure 12:
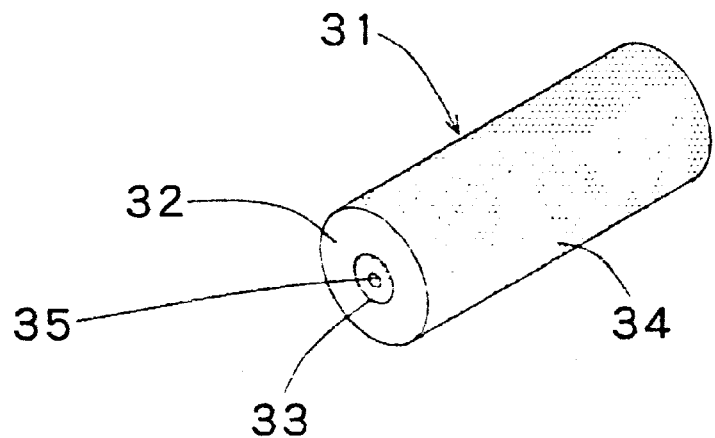
FIG. 12 is a perspective view illustrating a fourth embodiment of the present invention.
Figure 13:
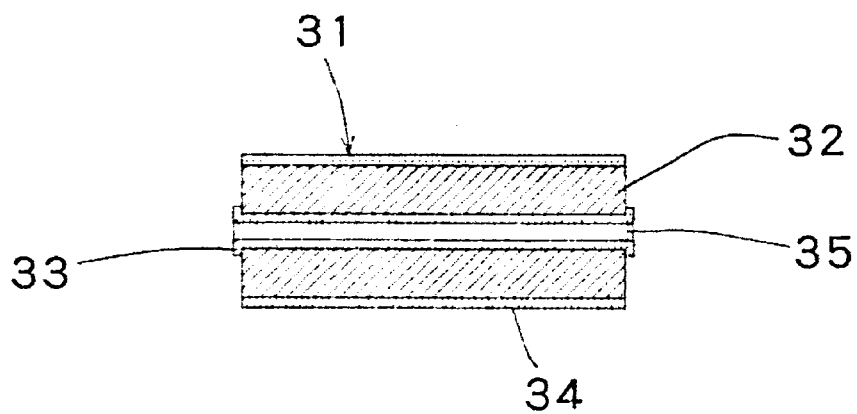
FIG. 13 is a side view thereof.

FIG. 12 and FIG. 13 show a fourth embodiment of the present invention. As shown in these drawings, a feed-through type EMI filter 31 comprises a cylindrical moldings (compact) 32 of composite magnetic material including flaky metal magnetic powder as a main component and a binder resin. It forms an inside electrode 33 on the inner peripheral face of the cylindrical moldings 32 and an outside electrode 34 on the outer peripheral face of the cylindrical compact. The inner and outer peripheral faces of the cylindrical moldings 32 are concentric. The inside of the inside electrode 33 constitutes a center conductor insertion portion 35 of a pass-through hole. The forming of said inside electrode 33 and outside electrode 34 can be performed mainly by plating technology and application of conductive paint.

The moldings 32 uses the composite magnetic material which includes a flaky (compressed) metal magnetic powder of Fe—Si alloy about 40 to 50 $\mu$m long, about 20 $\mu$m wide and about 10 $\mu$m thick wherein the complex relative permeability ($\mu r', \mu r''$) and the complex relative permittivity ($\epsilon r', \epsilon r''$) can be set in a high degree in a higher frequency (ranging from MHz band to GHz band) and a low cost polyester family resin, PPS (polyphenylenesulfide), etc. having formability and heat-stability used as binder. The composite magnetic material is heated, hardened in a predetermined shape (a cylindrical shape according to the present embodiment) and formed. However, the weight-% of the metal magnetic powder and the resin powder is 80:20 in the upper limit in view of the formability, while the lower limit of the weight-% of the metal magnetic powder is required to be not less than 50% by weight. If it is below 50% by weight, the characteristic as the magnetic material is greatly deteriorated. The magnetic property of said moldings 32 is the same with that of the composite magnetic material 4 in the first embodiment.

Figure 14:
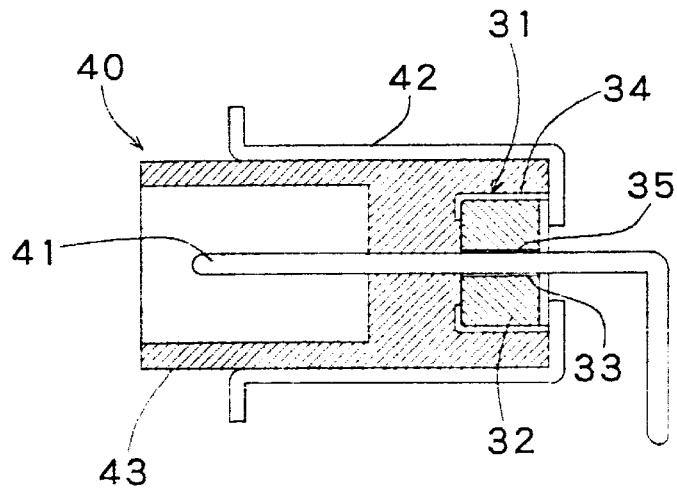
FIG. 14 is a side sectional view illustrating an example of the application to a connector of the feed-through type EMI filter relating to the fourth embodiment of the present invention.

FIG. 14 is an example of the application to a connector of the feed-through type EMI filter as shown in the fourth embodiment. As shown in this drawing, a connector 40 equipped with the feed-through type EMI filter can be realized by placing a conductor shield case 42 outside an armored insulating housing 43 after a terminal pin 41 of the connector is inserted into and connected with the center conductor insertion portion 35 of the feed-through type EMI filter. Further, the outside electrode 34 of the feed-through type EMI filter can be a bracket for earth connected to the shield case 42.

According to the feed-through type EMI filter as shown in the fourth embodiment, instead of the composite magnetic material being disposed inside the coaxial tube, it is possible to easily manufacture the feed-through type EMI filter in a low cost by forming electrodes 34, 35 on the outer and inner peripheral faces of the moldings 32 made of the composite magnetic material.

Figure 15:
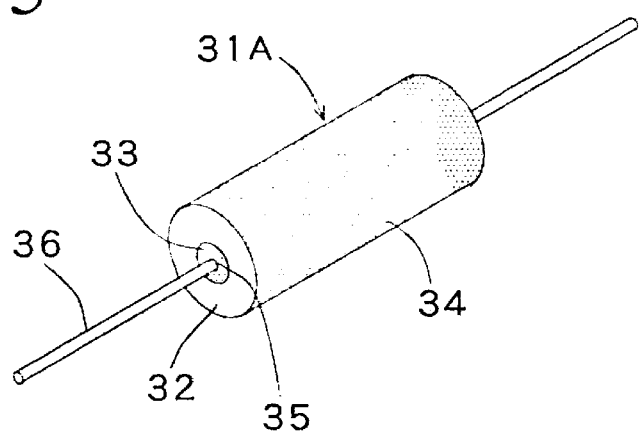
FIG. 15 is a perspective view illustrating a fifth embodiment of the present invention.
Figure 16:
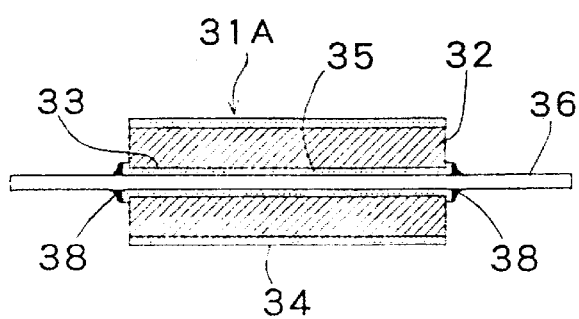
FIG. 16 is a side sectional view thereof.

FIG. 15 and FIG. 16 show a fifth embodiment of the present invention. In this case, a feed-through type EMI filter 31A includes flaky metal magnetic powder and a resin binder, and it includes a cylindrical moldings 32 of composite magnetic material comprising metal magnetic powder as a main component to be disposed around a center conductor 36. It includes an outside electrode 34 on the outer peripheral face of said cylindrical molding 32. In the case of the examples as shown in the drawings, however, the inside electrode 33 is disposed on the inner peripheral face concentric with the outer peripheral face of the cylindrical molding 32, and the center conductor 36 is inserted into the center conductor insertion portion 35 which is a pass-through hole of the inside electrode. The inside electrode 33 and the center conductor 36 are soldered or fixed by a conductive bonding agent 38.

It is to be noted that the composite magnetic material is formed in advance so that the cylindrical molding 32 can receive the inserted center conductor 36 without any space left, whereby the inside electrode 33 may be omitted. Further, the cylindrical moldings 32 may be prepared by forming the composite magnetic material integrally on the center conductor 36 in a forming process, and, even in this case, the inside electrode 33 can be omitted.

Figure 17:
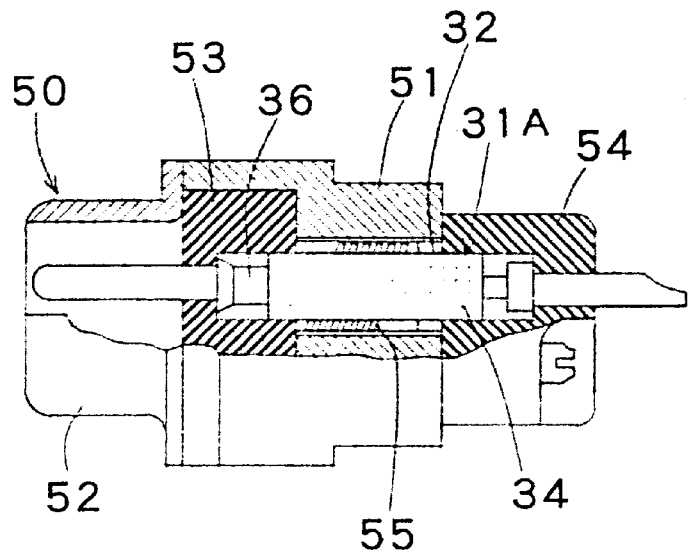
FIG. 17 is a side view partially made sectional illustrating an example of the application to a connector of the feed-through type EMI filter relating to the fifth embodiment of the present invention.
Figure 18:
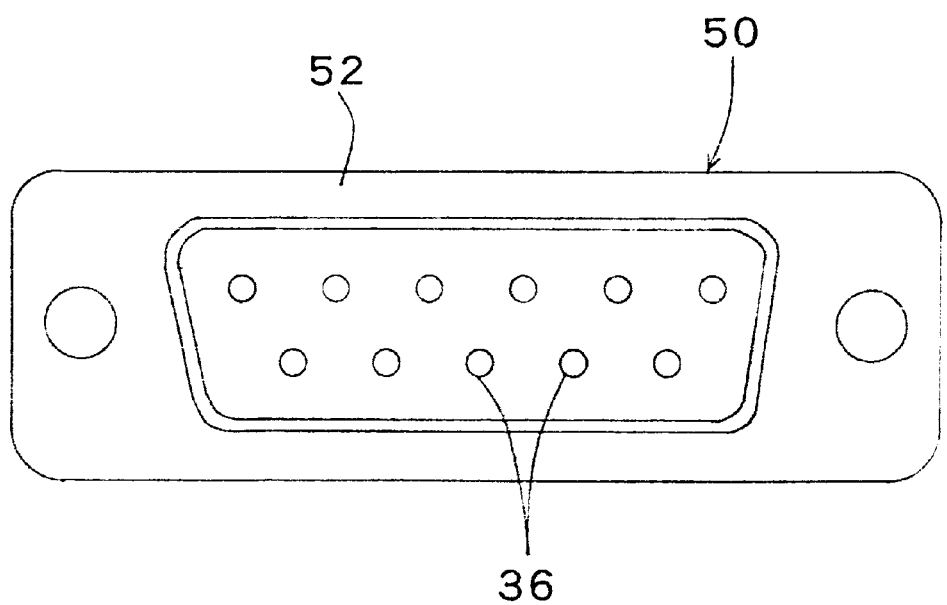
FIG. 18 is a front view thereof.

FIG. 17 and FIG. 18 are the examples of the application to a connector of the feed-through type EMI filter. As shown in these drawings, a connector 50 equipped with the feed-through type EMI filter 31A can be realized by making a terminal pin of a connector 50 penetrate into and be disposed on a ground plate 51 as the conductor 36 of a feed-through type EMI filter, and also by uniting a shell 52, a front portion insulating body 53 and a rear poriton insulating body 54 in front and in rear of the ground plate 51. Further, the outside electrode 34 of the feed-through type filter 31A is electrically connected to the ground plate 51 by a metal spring 55, etc.

In this way, the feed-through type EMI filter as shown in the fifth embodiment can engage with a optional connector terminal insertion hole depending on the outside diameter setting of the moldings 32 and is utilizable as means of realizing the connector 50 equipped with the feed-through type EMI filter.

Figure 19:
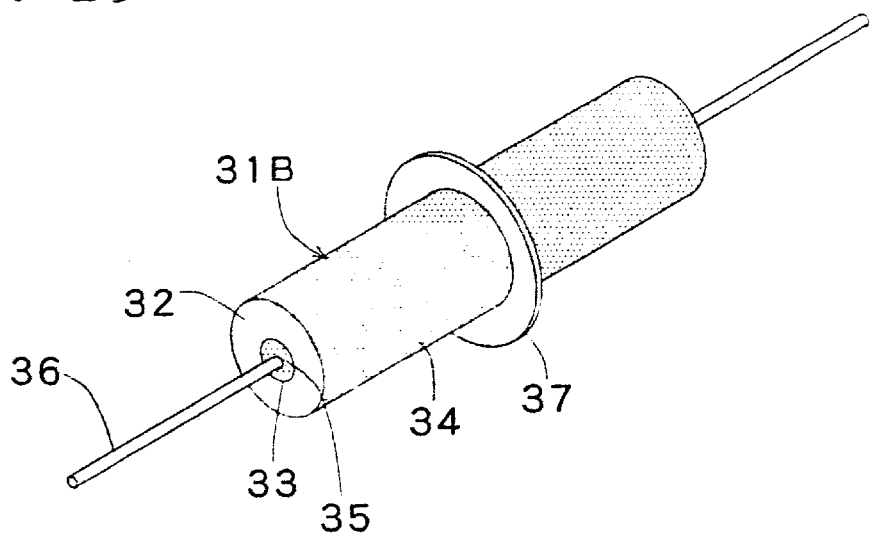
FIG. 19 is a perspective view of a sixth embodiment of the present invention.
Figure 20:
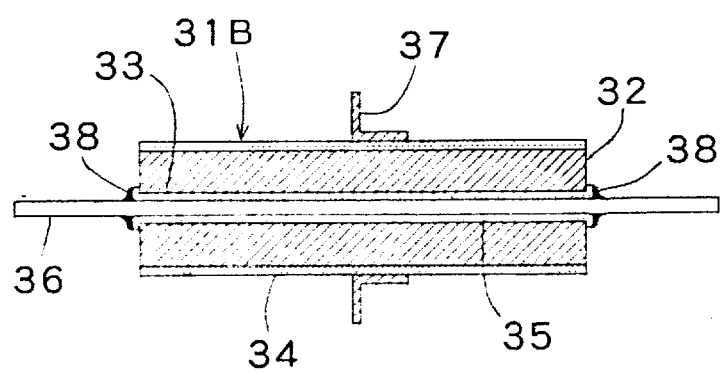
FIG. 20 is a side sectional view thereof.

FIG. 19 and FIG. 20 show a sixth embodiment of the present invention. In this case, a feed-through type EMI filter 31B includes flaky metal magnetic powder and a binder resin, and the cylindrical molding 32 is formed by the composite magnetic material comprising metal magnetic powder as a main component to be disposed around the center conductor 36. Further, a collar-shaped conductor 37 (metal collar) for fixing to a chassis is integrally united with the the outside electrode 34.

In the case of the example as shown in the drawing, however, the inside electrode 33 is formed on the inner peripheral face concentric with the outer peripheral face of the cylindrical moldings 32, and the center conductor 36 is inserted into the center conductor insertion portion 35 which is a pass-through hole of the inside electrode. The inside electrode 33 and the center conductor 36 are soldered or fixed by a conductive bonding agent 38.

It is to be noted that composite magnetic material is formed in advance so that the cylindrical compact can receive the center conductor 36 without any space left therein, whereby the inside electrode 33 may be omitted. Further, the cylindrical moldings 32 may be prepared by forming the composite magnetic material integrally on the center conductor 36 in a forming process, and, even in this case, the inside electrode 33 can be omitted.

In the case of this sixth embodiment, in addition to the operation effects of the fourth and fifth embodiments, there is a good advantage in that the feed-through,type EMI filter can be easily fixed on the other party's metal chassis, bracket, etc. by a collar-shaped conductor 37 and, at the same time, it is possible to earth the outside electrode 34.

Figure 21:
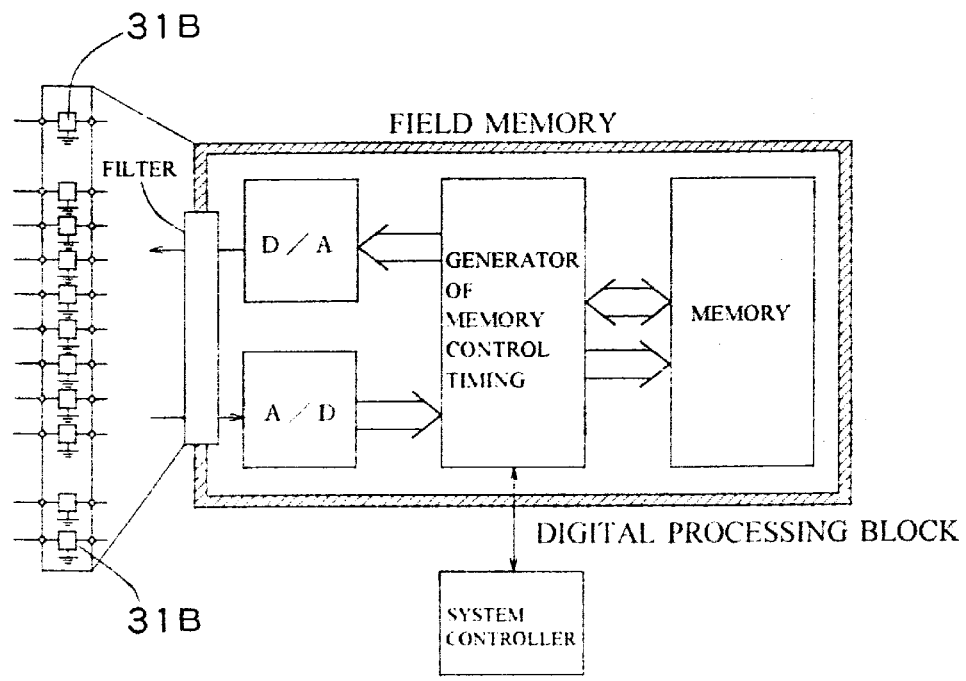
FIG. 21 is a block diagram illustrating an example of the application to a functional circuit of the feed-through type EMI filter.

FIG. 21 is an example of the application to a digital functional circuit (by which, an image processing circuit is meant in this example) of the feed-through EMI type filter as shown in the fifth embodiment. A number of the feed-through type EMI filters 1B are employed in the path of a power supply line and signal transmitting and receiving lines in the functional circuit to suppress conduction of the electromagnetic interference of the high frequency generated in the digital functional circuit and further to reduce radiative electromagnetic interference.

Figure 22:
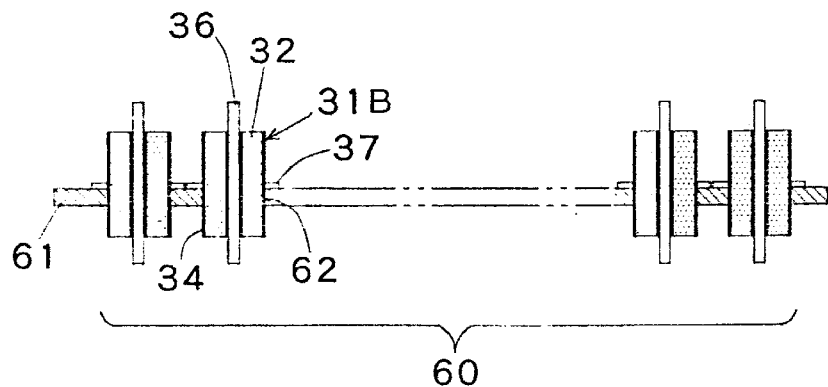
FIG. 22 is a seventh embodiment of the present invention to show a sectional view illustrating an array structure of the feed-through type EMI filter.
Figure 23:
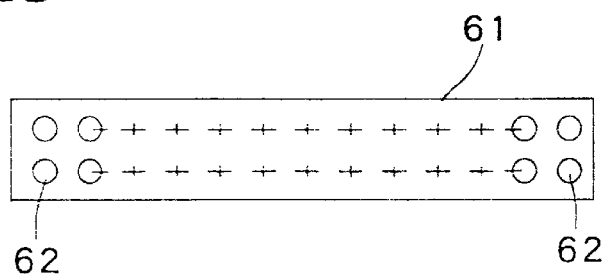
FIG. 23 is a front view illustrating the locations of brackets and fixing holes used in the seventh embodiment.

FIG. 22 and FIG. 23 are a seventh embodiment of the present invention to constitute an array of the feed-through type EMI filters. In this case, the array 60 of the feed-through type EMI filters 31B of the above described sixth embodiment are mounted on a conductive metal bracket 61 (or a metal chassis) forming a number of fixing holes 62, and the collar-shaped conductors 37 of respective feed-through type EMI filters 31B are fixed to the bracket 61 by soldering. Further, in the drawing, identical reference numerals are fixed to the same or corresponding portions with the sixth embodiment and the description thereof is omitted.

Similar to this seventh embodiment, making the feed-through type EMI filters into an array structure serves to suppress the conductive EMI, etc. of the digital functional circuit having a number of signal transmitting and receiving lines, etc.

It is to be noted that the array of the feed-through type EMI filters may be constituted by using the feed-through type EMI filters described in the fourth or fifth embodiments. In this case, the structure thereof can be adapted such that the outside electrode 34 is soldered and directly fixed to the bracket 6 by the conductive bonding agent, etc.

Figure 24:
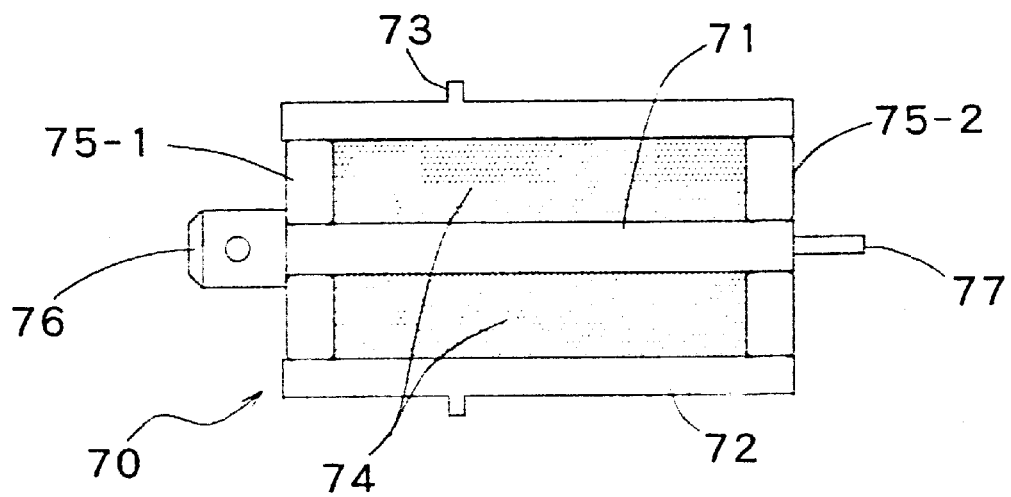
FIG. 24 is a eighth embodiment of the present invention to show a front sectional view illustrating the structure of the feed-through type EMI filter for a magnetron tube.
Figure 25:
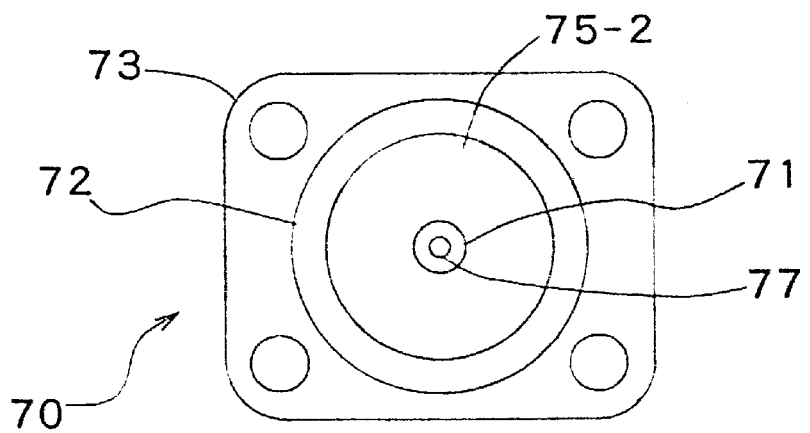
FIG. 25 is a side view thereof.
Figure 26:
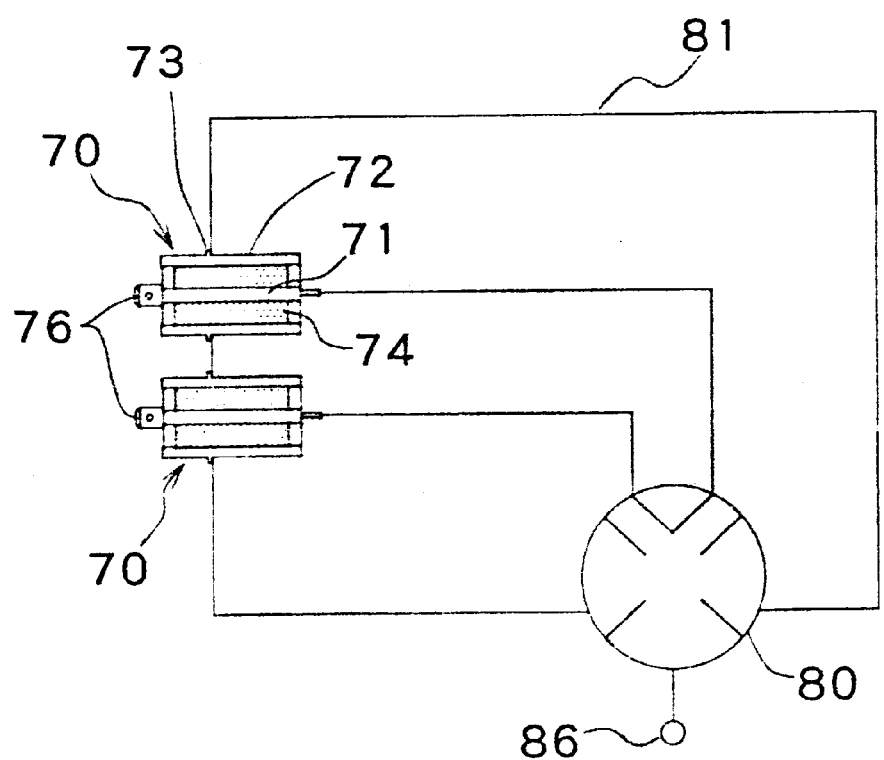
FIG. 26 is a schematic view illustrating an example of connecting to the magnetron tube of the feed-through type EMI filter in case of the eighth embodiment.

FIG. 24 and FIG. 25 are a eighth embodiment of the present invention to show a feed-through type EMI filter for a magnetron tube having a structure suitable to be inserted into a filament current supply line of the magnetron tube. FIG. 26 shows an example of connecting to the magnetron tube of the feed-through type EMI filter. In the drawing, 70 shows the whole of the EMI filter, 71 an inner conductor (a filament current supply line), 72 a cylindrical hollow conductor for earth (an outside conductor), 73 a collar-shaped conductor (a bracket to be fixed on a magnetron tube metal shield case), 74 a composite magnetic material, 75-1, 75-2, insulating lids formed of a compact such as resin, etc. and 76, 77, outside connecting terminals formed respectively on both ends of the inner conductor. The outside connecting terminal 76 serves as a cathode terminal which is projected outside the magnetron tube.

The inner conductor 71 is coaxially disposed in the center of the cylindrical hollow conductor 72 for earth and constitutes a coaxial tube. On one end of this coaxial tube, one insulating lid 75-1 is disposed and fixed. From the other end of the coaxial tube, the magnetic material 74 is inserted into a hollow portion between the inner conductor 71 and the hollow conductor 72 for earth, individually surrounding the inner conductor. After that, it is sealed by the other insulating lid 75-2. The insulating lids 75-1, 75-2 at both sides of the coaxial tube close and hold both opening portions of the hollow conductor 72 for earth so that the composite magnetic The composite magnetic material 74 of this case has the same composition with the composite magnetic material 4 of the first embodiment. It may be formed in advance, or instead of using shaped moldings, the composite magnetic material in which magnetic powder and resin powder as a binder are mixed and blended is pressurized and injected into the coaxial tube and, after that, it may be heated and hardened.

FIG. 26 shows a construction plan in which a feed-through type EMI filter 70 as illustrated in FIG. 24 and FIG. 25 is fixed on the metal shield case of the magnetron tube. In the drawing, 80 is a magnetron tube, 81 a metal shield case and 86 an output antenna. As shown in FIG. 26, the plan has the configuration wherein each of independent feed-through type EMI filters is fixed on two lines supplying filament current to the magnetron tube. To be specific, each of the feed-through type EMI filters 70 is disposed so as to penetrate the metal shield case 81, and a collar-shaped conductor portion 73 perpendicular to the hollow conductor 72 for earth is closely attached to the metal shield case 81 and fixed therein by screws so as not to generate an electromagnetic wave leak.

Figure 38:
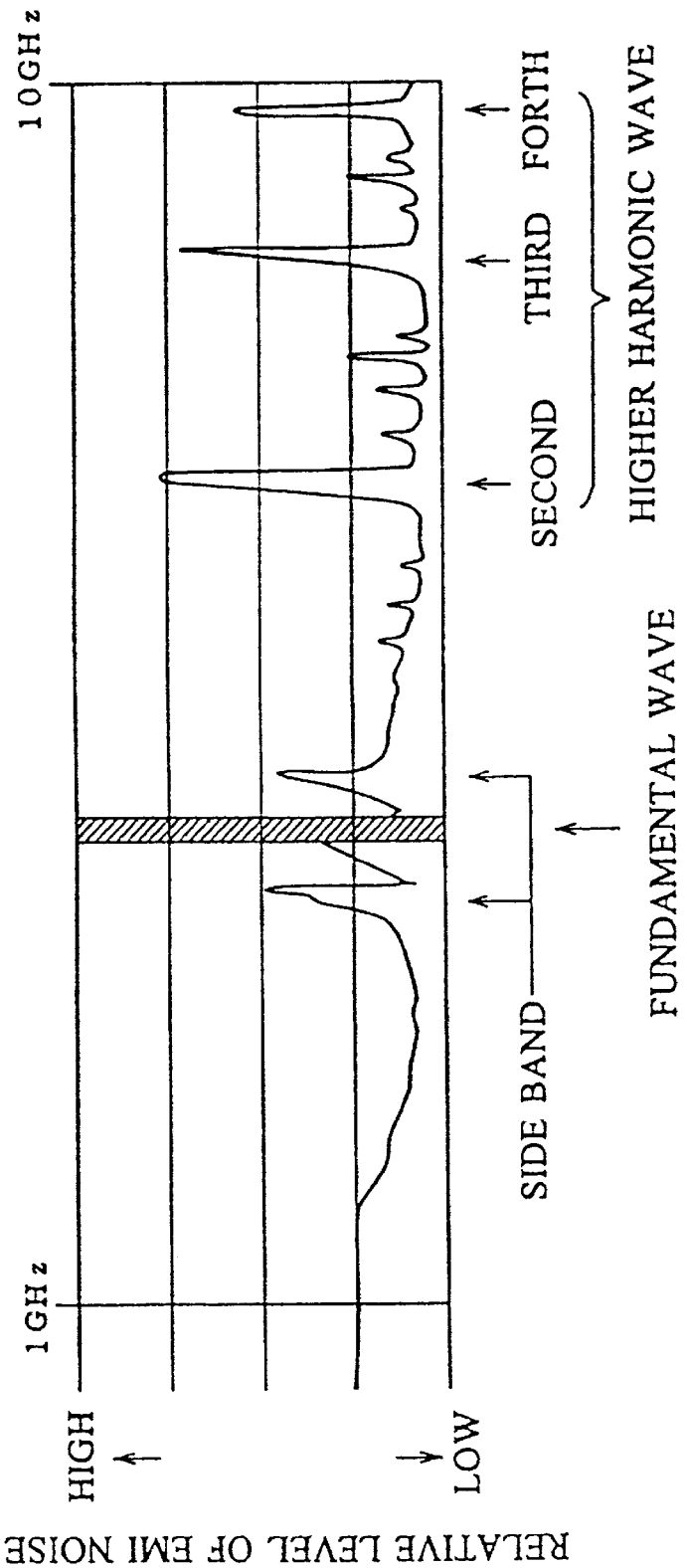
FIG. 38 is a frequency spectrum diagram of an electromagnetic interference generated by the magnetron tube.
Figure 39:
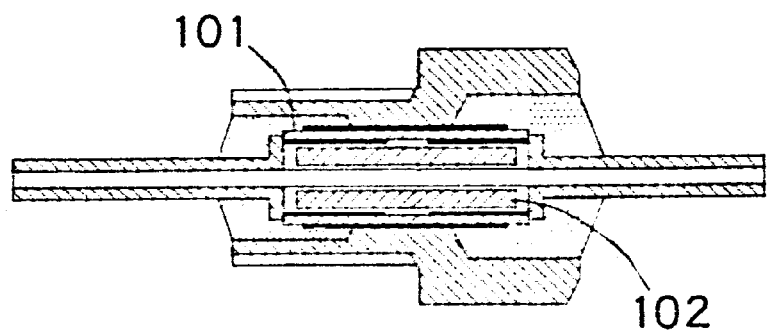
FIG. 39 is a front sectional view illustrating an conventional example 1 of the feed-through type EMI filter.
Figure 40:
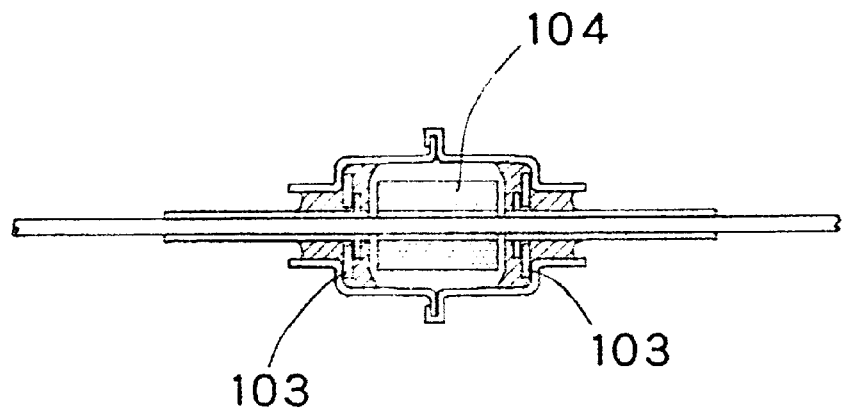
FIG. 40 is a front sectional view illustrating the conventional example 2 of the feed-through type EMI filter.
Figure 41:
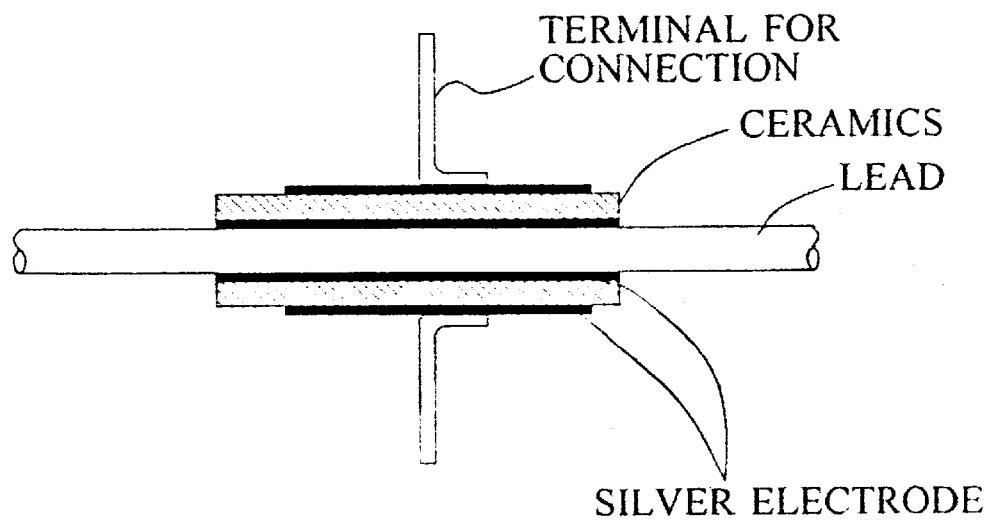
FIG. 41 is a sectional view explaining that a cylindrical feed-through type ceramic capacitor has a resonant frequency based on a configuration.
Figure 42:
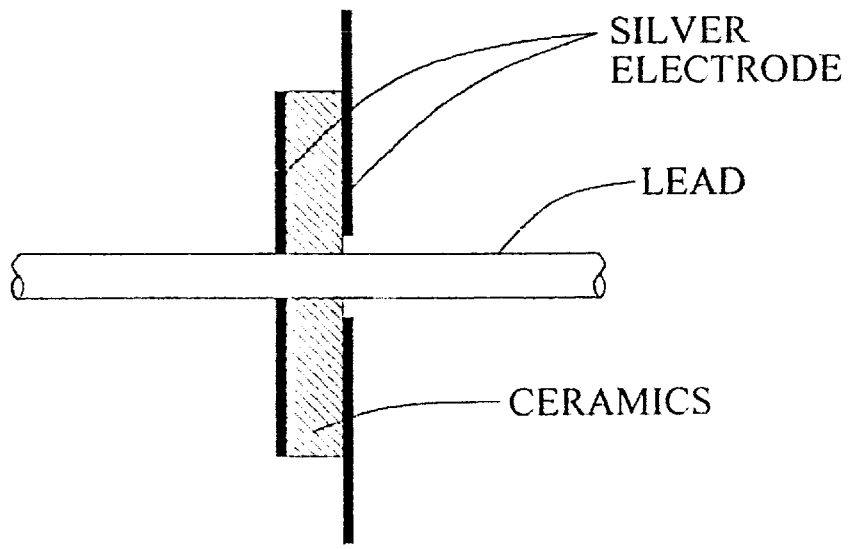
FIG. 42 is a sectional view explaining that the disc-shaped feed-through type ceramic capacitor has the resonant frequency based on the configuration.
Figure 43:
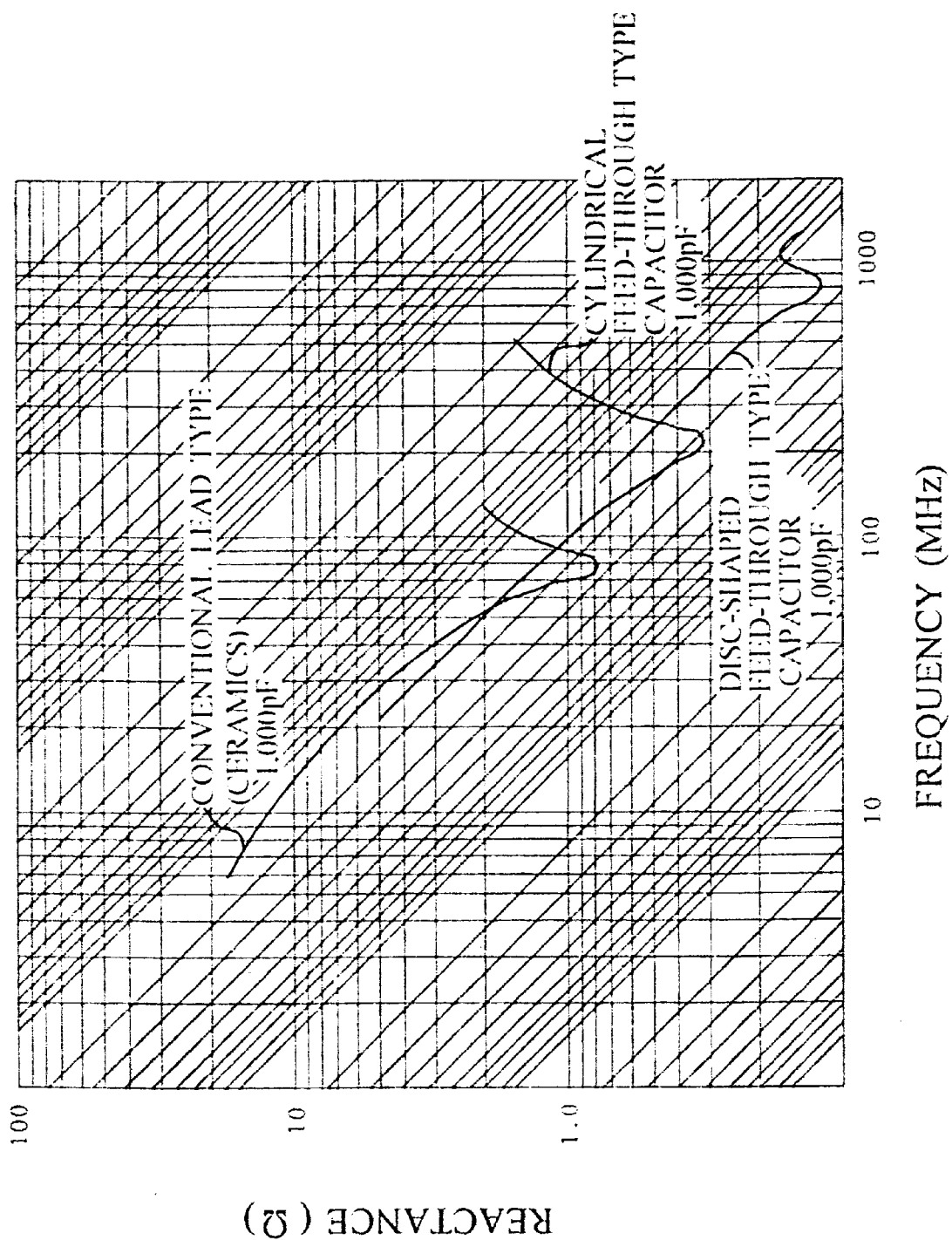
FIG. 43 is a graph showing the frequency characteristic of the reactance of the feed-through type capacitor.
Figure 44:
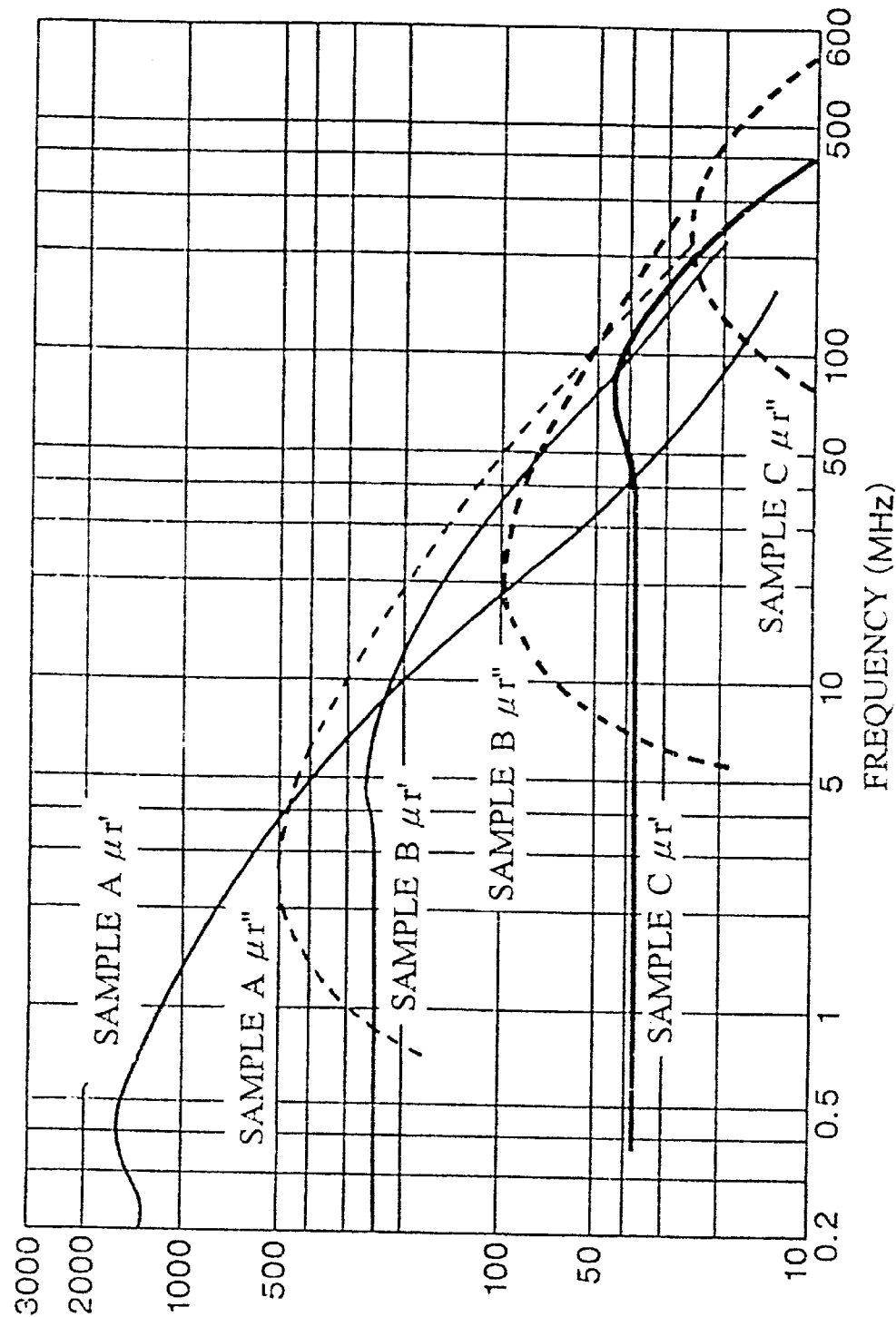
FIG. 44 is a graph showing the frequency characteristic of the complex relative permeability of ferrite samples.

In this eighth embodiment, the electromagnetic interference (particularly the conductive EMI in the normal mode) generated from the magnetron tube can be effectively suppressed by inserting the feed-through type EMI filter which can secure sufficient attenuation characteristic in the frequency band (2.2 GHz to 9.8 GHz) including the higher harmonic frequency of the magnetron tube as shown in FIG. 38 into the two lines supplying the filament current of the magnetron tube. In this case, since it is an EMI filter which does not use a choke coil, it is possible to substantially reduce temperature rise and electric power consumption. Further, it does not have a self-resonance and shows a high attenuation characteristic in the GHz band. It is effective to suppress the conductive EMI ranging from fundamental wave to higher harmonic which conducts the filament current supply line of the magnetron tube. Only one element will do for the EMI filter, which may be inserted into each of the filament current supply lines of the magnetron tube. This reduces the number of elements largely, compared to inserting a low pass filter made from a feed-through type capacitor and a choke coil into each line respectively, whereby the cost is made cheap and reliability is enhanced owing to the reduced number of elements and connecting points. Further, since the element required for each line is only one piece, the space required at the magnetron tube side may be narrow.

Figure 27:
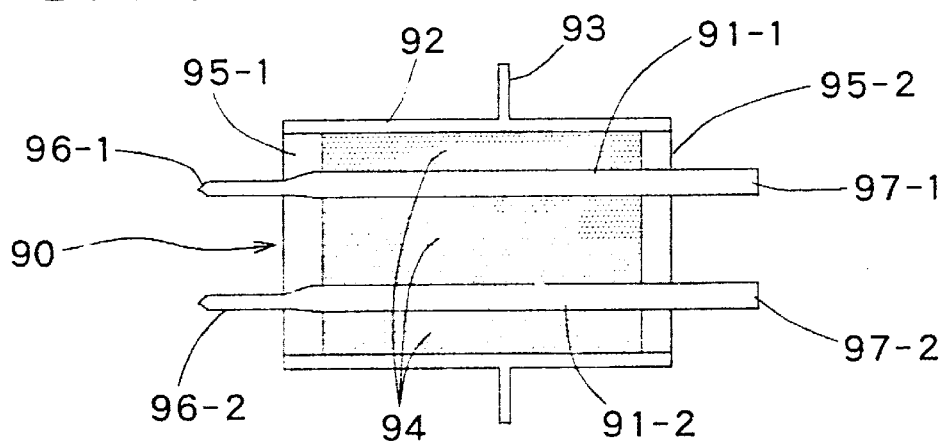
FIG. 27 is a plan sectional view illustrating a ninth embodiment of the present invention.
Figure 28:
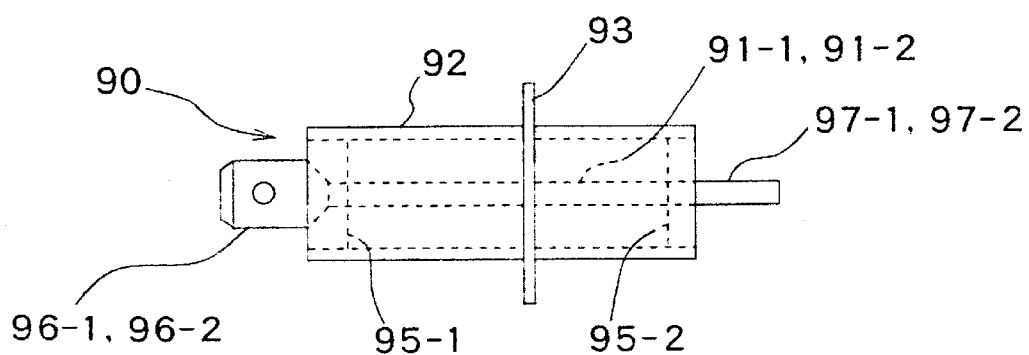
FIG. 28 is a front view thereof.
Figure 29:
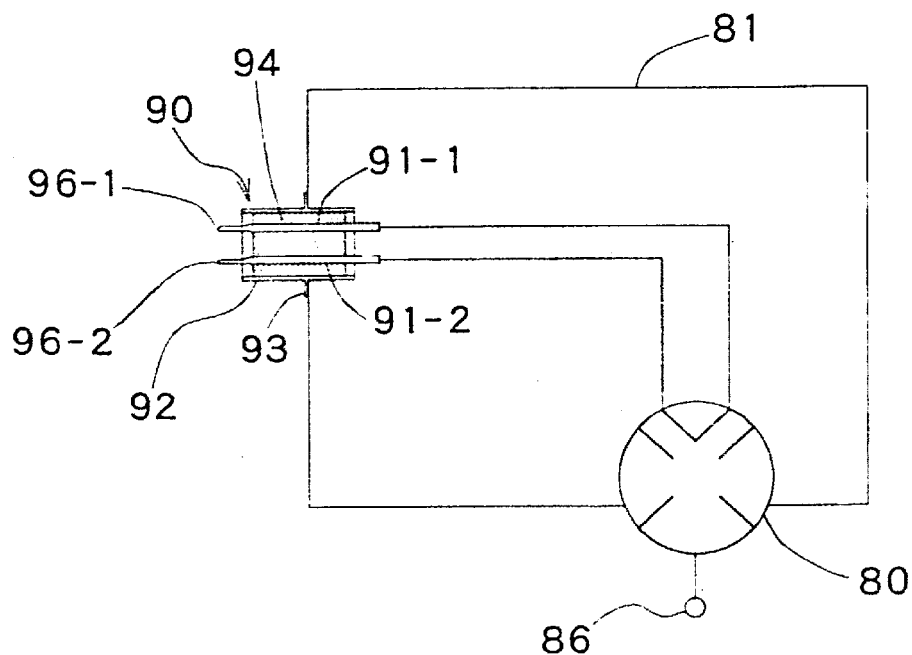
FIG. 29 is a schematic view illustrating an example of connecting to the magnetron tube of the feed-through type EMI filter in case of the ninth embodiment.

FIG. 27 and FIG. 28 show a ninth embodiment of a feed-through type EMI filter for a magnetron tube, and FIG. 29 an example of connecting to the magnetron tube of the feed-through type EMI filter, respectively. In the drawings, 90 shows the whole of the EMI filter, 91-1, 91-2 a pair of inner conductors (a pair of filament current supply lines), 92 compressed cylindrical hollow conductor for earth (an outer conductor), 93 a collar-shaped conductor integral with the hollow conductor for earth and projected prependicular therefrom (for connecting on a magnetron tube metal shield case), 94 a composite magnetic material, 95-1, 95-2 insulating lids formed by the moldings made of resin, etc., 96-1, 97-1 outer connecting terminals formed respectively at both ends of the inner conductor 91-1 and 96-2, 97-2 outer conductors form ed respectively at both ends of the inner conductor 91-2. The outer connecting terminals 96-1, 96-2 serve as a cathode terminal projected outside the magnetron tube.

The compressed cylindrical (for example, the sectional view thereof is rectangular) hollow conductor 92 for earth equally surrounds a pair of the inner conductors 91-1, 91-2. At one end thereof, one insulating lid 95-1 is disposed, and from the other end thereof, said composite magnetic material 94 is inserted into a hollow space between the inner conductors 91-1, 91-2 and the hollow conductor 92 for earth. After that, it is sealed by the other insulating lid 95-2. The insulating lids 95-1, 95-2 at both ends of the hollow conductor for earth close and hold both end opening portions thereof and support said inner conductors 91-1, 91-2 in a penetrant state.

Further, the composite magnetic material 94 is prepared by heating and hardening into a predetermined shape the same material with the composite magnetic material described in the eighth embodiment, i.e. which consists of magnetic powder of the flake like (compressed) Fe—Si alloy and the binder resin. Or, instead of using the moldings as the composite magnetic material 94, the composite magnetic material in which magnetic powder and resin powder as a binder are mixed and blended is pressurized and injected into the hollow portion and, after that, it can be used when heated and hardened.

FIG. 29 shows a construction plan in which a feed-through type EMI filter 90 as shown in FIG. 27 and FIG. 28 is fixed on the metal shield case 81 of a magnetron tube 80. The feed-through type EMI filter 90 has two inner conductors 91-1, 91-2 inside one piece of the hollow conductor 92 for earth and takes a configuration in which one piece of the feed-through type EMI filter 90 is fixed equally on two lines supplying the filament current to be able to effectively suppress the electromagnetic interference (particularly the normal mode interference) generated from the magnetron tube 80. To be specific, the feed-through type EMI filter 90 is disposed so as to penetrate the metallic shield case 81, and a collar-shaped conductor 93 having a face prependicular to the hollow conductor 92 for earth is closely attached to the metal shield case 81 so as not to generate the electromagnetic wave leak. Further, in FIG. 29, identical reference numerals are applied to the same or corresponding portion with FIG. 26.

According to this ninth embodiment, only one element of the EMI filter (heretofore, three to four elements are used) will do for the two lines supplying the filament current of the magnetron tube. Hence, it is possible to realize simplification of the structure, reduction in fixing space, improvement of fixing operation, reduction in the prime cost and reduction in fixing cost. Other advantageous effects are the same with those of the eighth embodiment as described above.

Figure 30:
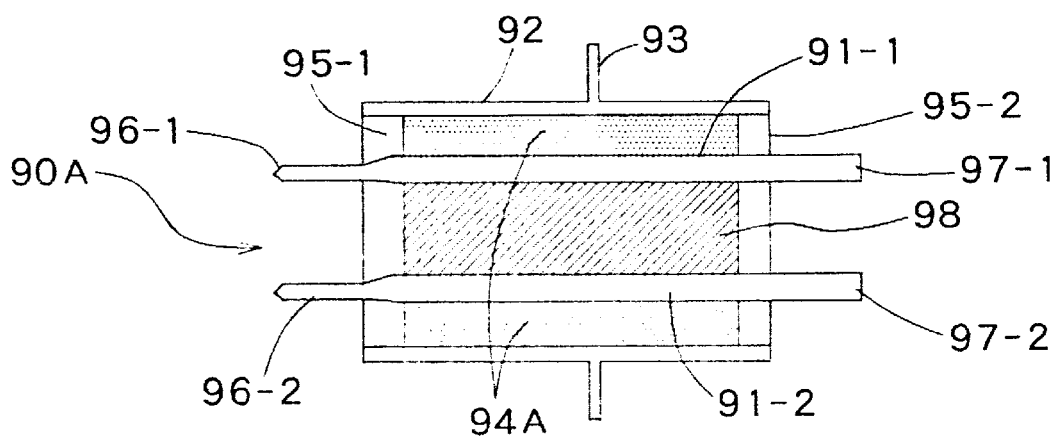
FIG. 30 is a plan sectional view illustrating a tenth embodiment of the present invention.
Figure 31:
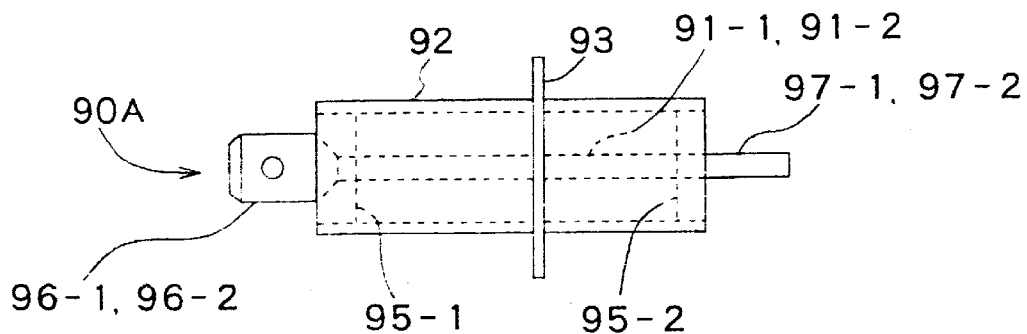
FIG. 31 is a front view thereof.
Figure 32:
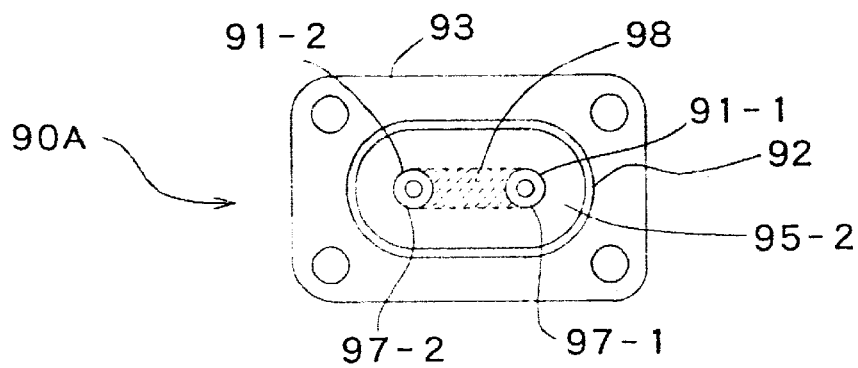
FIG. 32 is a side view thereof.
Figure 33:
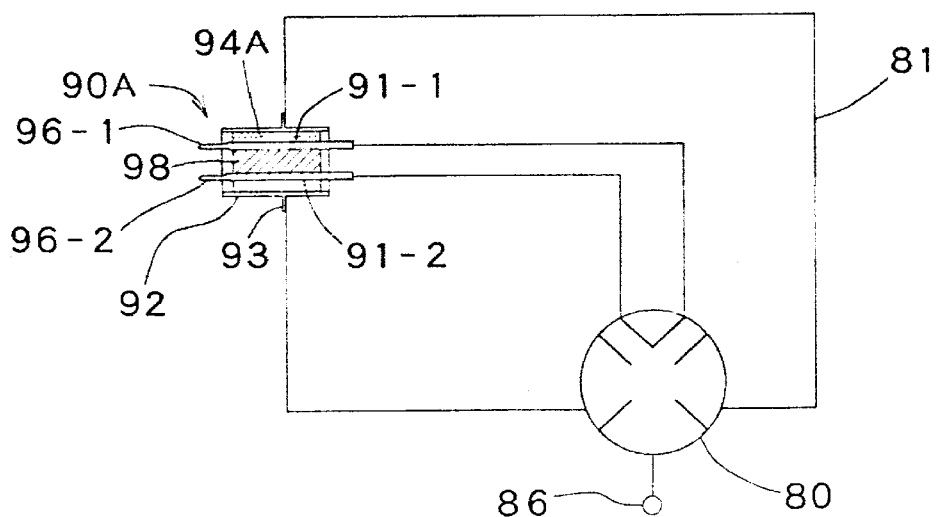
FIG. 33 is a schematic view illustrating an example of connecting to the magnetron tube of the feed-through type EMI filter in case of the tenth embodiment.

FIG. 30 to FIG. 32 show a tenth embodiment of the feed-through type EMI filter for the magnetron tube, and FIG. 33 an example of connecting to the magnetron tube thereof, respectively. In the drawings, 90A shows the whole of the EMI filter, 91-1,91-2 a pair of the inner conductors (a pair of the filament current supply lines), 92 the compressed cylindrical hollow conductor for earth (an outer conductor), 93 a chassis integral with the hollow conductor for earth and projected vertically (a collar-shaped conductor fixed on the magnetron tube metal shield case), 94A the composite magnetic material, 95-1,95-2 insulating lids formed of the moldings such as resin, etc., 96-1,97-1 the outer connecting terminals formed respectively at both ends of the inner conductor 91-1, 96-2,97-2 the outer connecting terminals formed respectively at both ends of the inner conductor 91-2 and 98 a non-magnetic insulator.

The non-magnetic insulator 98 is the molding (compact) of resin, etc. having a thickness approximately equal to the conductor diameter (or the conductor thickness) of two inner conductors 91-1,91-2 which are parallel and serve as the filament current supply lines, and it is disposed between those inner conductors 91-1,91-2 and integral with them. By this insulator 98, the composite magnetic material is prevented from coming between two inner conductors 91-1, 91-2 across all the length of the composite magnetic material 94A. Therefore, the composite magnetic material 94A disposed in a hollow portion between the inner conductors 91-1,91-2 and the hollow conductor 92 for earth surrounding them equally becomes a sectionally elliptical shaped cylinder body. Here the composite magnetic material 94A is made of the same material as that of the composite magnetic material as described in the ninth embodiment.

FIG. 33 is a construction plan in which the pass-through type EMI filter 90A as shown in FIG. 30 to FIG. 32 is fixed on the metal shield case of the magnetron tube. The pass-through type EMI filter 90A has two inner conductors 91-1,91-2 inside one hollow conductor 92 for earth and takes the configuration in which one piece of the pass-through type EMI filter 90A is equally fixed on two lines supplying the filament current. It can effectively suppress the electromagnetic interference (particularly, the conductive EMI in the common mode) generated from the magnetron tube.

Note that other structures and operation effects are the same with those of the ninth embodiment as described above. Hence, the description thereof is omitted by attaching identical reference numerals to the same or corresponding portion thereof.

Figure 34:
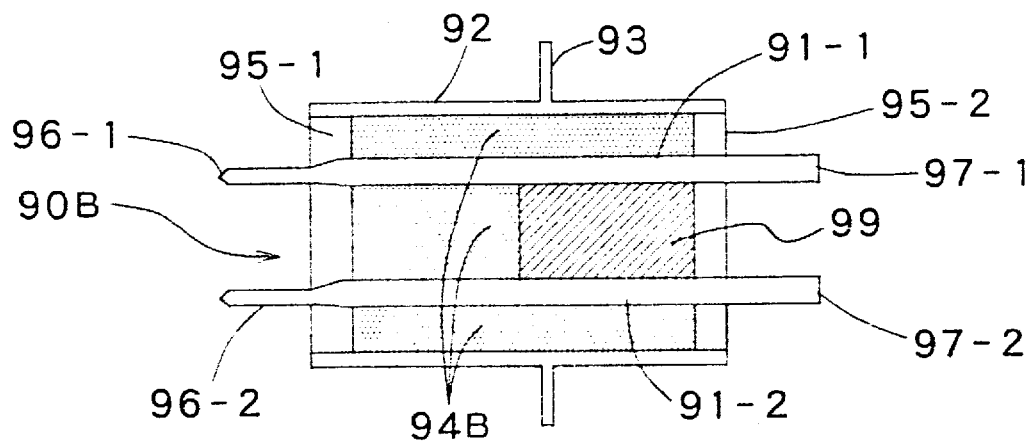
FIG. 34 is a plan sectional view illustrating a eleventh embodiment of the present invention.
Figure 35:
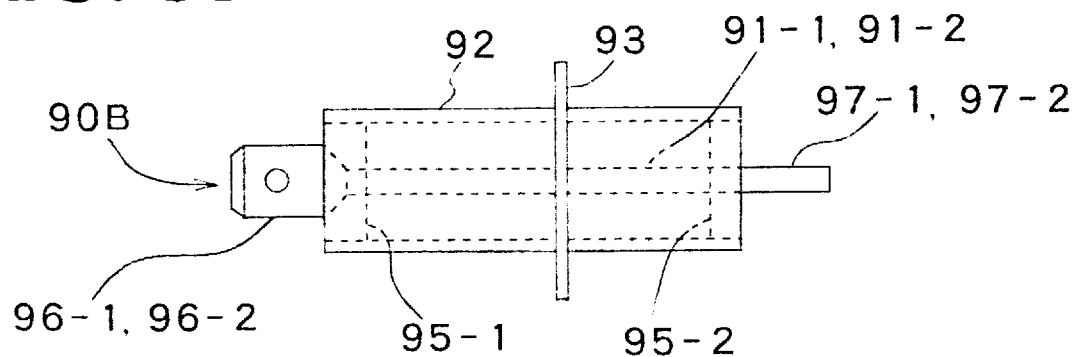
FIG. 35 is a front view thereof.
Figure 36:
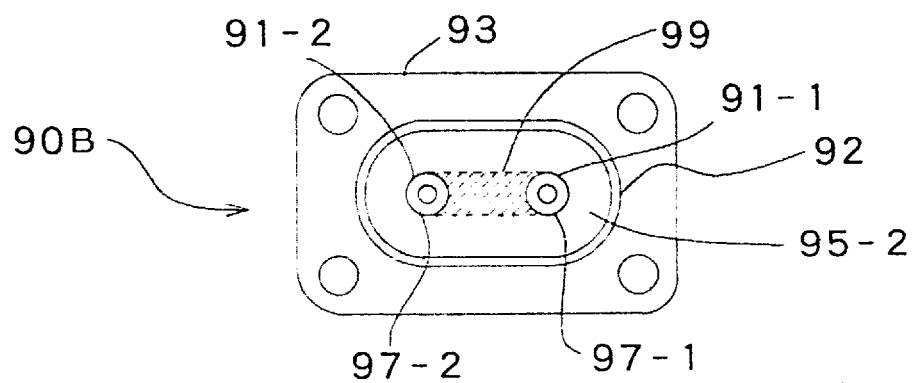
FIG. 36 is a side view thereof.
Figure 37:
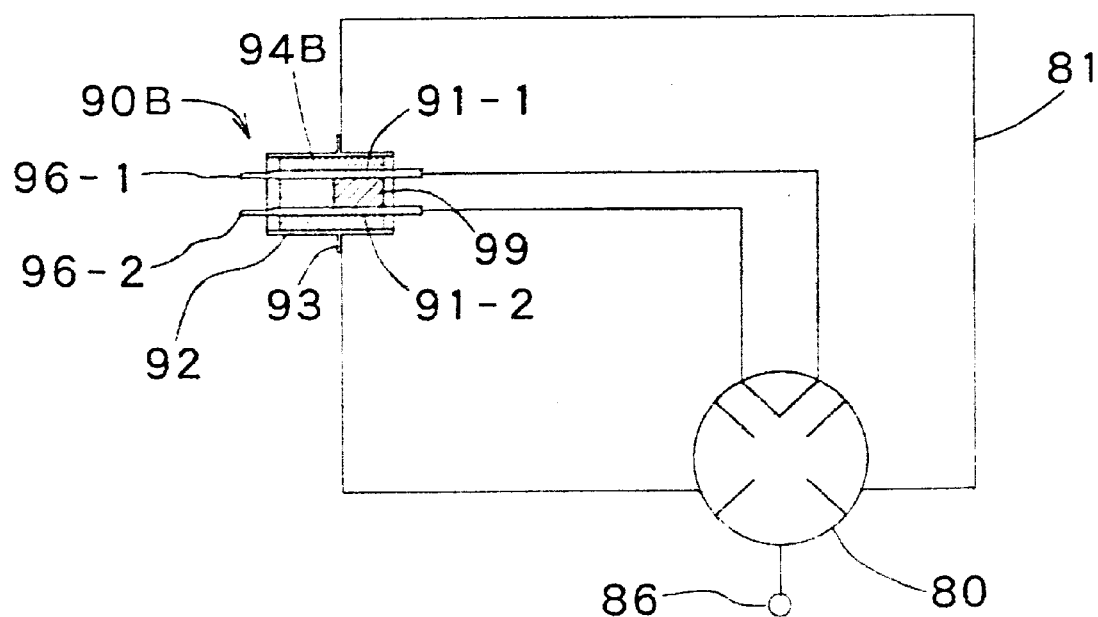
FIG. 37 is a schematic view illustrating an example of connecting to the magnetron tube of the feed-through type EMI filter in case of the eleventh embodiment.

FIG. 34 to FIG. 36 show a eleventh embodiment of the feed-through type EMI filter for the magnetron tube, and FIG. 37 an example of connecting to the magnetron tube of the feed-through type EMI filter. In the drawings, 90B shows the whole of the EMI filter, 91-1,91-2 a pair of the inner conductor (a pair of the filament current supply lines), 92 a compressed cylindircal hollow conductor for earth (an outer conductor), 93 a collar-shaped conductor (a bracket fixed on the magnetron tube metal shield case) integral with the hollow conductor for earth and projected outwardly 94B the composite magnetic material, 95-1,95-2 insulating lids formed by the moldings of resin, etc., 96-1,97-1 the outer connecting terminals formed respectively at both ends of the inner conductor 91-1, 96-2,97-2, the outer connecting terminals formed respectively at both ends of the inner conductor 91-2, and 92 an non-magnetic insulator.

The non-magnetic insulator 99 is the molding (compact), etc. of resin, etc. having a thickness approximately equal to the conductor diameter (or the conductor thickness) of two inner conductors 91-1,91-2 which are in parallel and serve as the filament current supply lines, and it is disposed between those inner conductors 91-1,91-2 and integral with them. However, the insulator 99 prevents the composite magnetic material from coming between the two inner conductors 91-1,91-2 in part of the length of the composite magnetic material 94. For this reason, the composite magnetic material 94B disposed in a hollow portion between the inner conductors 91-1,91-2 and the hollow conductor 92 for earth surrounding them forms a sectonally elliptical shaped cylinder body which largely and equally surrounds the two inner conductors 91-1,91-2 in the insulator disposed portion, while the other portion forms a spectacle frame shape which dives in-between the inner conductors 91-1,91-2 and surrounds each of the inner conductors 91-1,91-2, respectively. Here, the composite magnetic material 94B is the same material as that of the composite magnetic material 94 as described in the ninth embodiment.

FIG. 37 is a construction plan in which the feed-through type EMI filter 90B as shown in FIG. 34 to FIG. 36 is fixed on the metal shield case 81 of the magnetron tube 80. The feed-through type EMI filter 90B has two inner conductors 91-1,91-2 inside one piece of the hollow conductor 92 for earth and takes the configuration in which one piece of the feed-through type EMI filter 90B is equally fixed on the two lines supplying the filament current. Further, since the composite magnetic material 94B has the portion largely and equally surrounding the two inner conductors 91-1,91-2 and the portion surrounding the two inner conductors 91-1,91-2 respectively, the electromagnetic interference (the conductive EMI in both normal and common mode) can be effectively suppressed.

Note that other structures and operation effects are the same with those of the ninth embodiment. Hence, the description thereof is omitted by applying identical reference numerals to the same or corresponding portion thereof.

Although, in each of the above described embodiments, magnetic metal flakes of Fe—Si families are shown as usable metal magnetic powder, magnetic metal flakes of Fe—Ni, Fe—Al—Si families, etc. which have a high complex relative permeability in the GHz band compared to the ferrite can be also used. Further, in each of the above described embodiments, the moldings or compact of the composite magnetic material comprising magnetic metal flakes as a main component is apparently usable.

As described above, according to the feed-through type EMI filter relating to the present invention, since the composite magnetic material comprising magnetic metal flakes of Fe—Si, Fe—Ni, Fe—Al—Si families, etc. as main component is disposed between the inner conductors and the outer conductor surrounding them, an insertion loss characteristic high enough to reach the high frequency (particularly up to the GHz band) can be obtained for the conductive EMI which is conducted on the electric power line of alternating and direct current, the signal line, the control line, etc. Further, since the feed-through type EMI filter is of a simple structure with few number of elements used and easy to assemble, it is possible to reduce the dispersion of characteristic and to manufacture it in a low cost.

What is claimed is:

1. A feed-through EMI filter comprising a hollow outer conductor, an inner conductor passing through but not contacting the outer conductor, and a composite magnetic material disposed between the outer conductor and the inner conductor, the composite magnetic material comprising magnetic metal flakes having a length of less than 50 $\mu$m and a complex relative permeability having a real part of at least 3 and an imaginary part of at least 2, at 1 GHz.

2. The feed-through EMI filter according to claim 1, including insulating lids supporting the inner conductor in a feed-through arrangement and closing open ends of the outer conductor.

3. The feed-through EMI filter according to claim 1, including a ferrite bead disposed between the outer conductor and the inner conductor, surrounding a part of the inner conductor.

4. The feed-through EMI filter according to claim 1, wherein the outer conductor comprises an outer electrode disposed on an outer surface of the composite magnetic material and the inner conductor comprises an inner electrode disposed on an inner surface of the composite magnetic material.

5. The feed-through EMI filter according to claim 1, wherein the composite magnetic material is disposed surrounding an outer surface of the inner conductor and the outer conductor comprises an outer electrode disposed on an outer surface of the composite magnetic material.

6. The feed-through EMI filter according to claim 1, wherein the inner conductor is part of a filament current supply line of a magnetron tube and the outer conductor is a hollow grounding conductor.

7. The feed-through EMI filter according to claim 1 wherein said magnetic metal flakes are selected from the group consisting of Fe—Si, Fe—Ni, and Fe—Al—Si.

8. The feed-through EMI filter according to claim 1 wherein the composite magnetic material includes an electrically insulating resin in which the magnetic metal flakes are dispersed.

9. A feed-through EMI filter comprising a plurality of feed-through EMI filter elements, each EMI filter element comprising a composite magnetic material comprising magnetic metal flakes having a length of less than 50 $\mu$m and a complex relative permeability having a real part of at least 3 and an imaginary part of at least 2, at 1 GHz, the composite magnetic material having a plurality of through holes, each through hole comprising part of one of the feed-through EMI filter elements, each through hole including an inner electrode disposed on an inner surface of one of the through holes of the composite magnetic material and an outer electrode disposed on an outer surface of the composite magnetic material.

10. The feed-through EMI filter according to claim 9 wherein said magnetic metal flakes are selected from the group consisting of Fe—Si, Fe—Ni, and Fe—Al—Si.

11. The feed-through EMI filter according to claim 9 wherein the composite magnetic material includes an electrically insulating resin in which the magnetic metal flakes are dispersed.

12. A feed-through EMI filter including a plurality of EMI filter elements, each EMI filter element comprising a composite magnetic material comprising magnetic metal flakes having a length of less than 50 μm and a complex relative permeability having a real part of at least 3 and an imaginary part of at least 2, at 1 GHz, the composite magnetic material having a plurality of through holes, each EMI filter element having an inner conductor, part of the inner conductors of each EMI filter element being surrounded by the composite magnetic material, the composite magnetic material including an outer electrode disposed on an outer surface of the composite magnetic material.

13. The feed-through EMI filter according to claim 12 including two spaced part inner conductors as filament current supply lines for a magnetron tube, wherein a part of the composite magnetic material is disposed between the filament current supply lines and the outside electrode commonly surrounds the filament current supply lines.

14. The feed-through EMI filter according to claim 13, including an insulator disposed between a part of the filament current supply lines.

15. The feed-through EMI filter according to claim 13 wherein said magnetic metal flakes are selected from the group consisting of Fe—Si, Fe—Ni, and Fe—Al—Si.

16. The feed-through EMI filter according to claim 13, wherein the outer conductor is electrically connected to a metal shield of the magnetron tube.

17. The feed-through EMI filter according to claim 13 wherein the composite magnetic material includes an electrically insulating resin in which the magnetic metal flakes are dispersed.

18. The feed-through EMI filter according to claim 12 wherein the composite magnetic material includes an electrically insulating resin in which the magnetic metal flakes are dispersed.

19. The feed-through EMI filter according to claim 12 wherein said magnetic metal flakes are selected from the group consisting of Fe—Si, Fe—Ni, and Fe—Al—Si.

* * * * *